US012604641B2

(12) United States Patent
Madono

(10) Patent No.: US 12,604,641 B2
(45) Date of Patent: Apr. 14, 2026

(54) DISPLAY DEVICE

(71) Applicant: Sharp Display Technology Corporation, Kameyama City (JP)

(72) Inventor: Hiroyuki Madono, Kameyama City (JP)

(73) Assignee: Sharp Display Technology Corporation, Kameyama City (JP)

( * ) Notice: Subject to any disclaimer, the term of this patent is extended or adjusted under 35 U.S.C. 154(b) by 379 days.

(21) Appl. No.: 18/560,871

(22) PCT Filed: Jun. 22, 2021

(86) PCT No.: PCT/JP2021/023617
§ 371 (c)(1),
(2) Date: Nov. 14, 2023

(87) PCT Pub. No.: WO2022/269756
PCT Pub. Date: Dec. 29, 2022

(65) Prior Publication Data
US 2024/0260409 A1 Aug. 1, 2024

(51) Int. Cl.
*H10K 59/80* (2023.01)
*H10K 59/121* (2023.01)
*H10K 59/131* (2023.01)

(52) U.S. Cl.
CPC ....... *H10K 59/873* (2023.02); *H10K 59/1213* (2023.02); *H10K 59/131* (2023.02)

(58) Field of Classification Search
CPC ............. H10K 59/873; H10K 59/1213; H10K 59/131; G09F 9/30
See application file for complete search history.

(56) References Cited

U.S. PATENT DOCUMENTS

| | | | | |
|---|---|---|---|---|
| 10,707,282 | B1 * | 7/2020 | Yang | H10K 59/122 |
| 11,251,400 | B2 * | 2/2022 | Cheng | H10K 59/873 |
| 11,961,845 | B2 * | 4/2024 | Li | H10D 86/60 |
| 2007/0188093 | A1 * | 8/2007 | Nagara | H10K 59/173 |
| | | | | 313/504 |
| 2014/0217397 | A1 * | 8/2014 | Kwak | H10D 86/441 |
| | | | | 257/43 |
| 2017/0148856 | A1 * | 5/2017 | Choi | H10K 59/873 |
| 2019/0051859 | A1 | 2/2019 | Choi et al. | |
| 2020/0052051 | A1 * | 2/2020 | Lee | H10D 86/451 |
| 2020/0083475 | A1 | 3/2020 | Kang et al. | |
| 2020/0235333 | A1 * | 7/2020 | Sung | G06F 1/1686 |
| 2020/0328376 | A1 * | 10/2020 | Seo | H10K 59/8731 |
| 2021/0036093 | A1 * | 2/2021 | Okabe | H10K 59/8722 |
| 2022/0029126 | A1 * | 1/2022 | Ohta | H05B 33/10 |

FOREIGN PATENT DOCUMENTS

JP        2019-035950 A      3/2019

* cited by examiner

*Primary Examiner* — Scott B Geyer
(74) *Attorney, Agent, or Firm* — ScienBiziP, P.C.

(57) ABSTRACT

A plurality of inversely tapered protruding portions are provided so as to surround a through-hole in a non-display region, each of the plurality of inversely tapered protruding portions includes a resin portion constituted by a resin substrate layer and separated by a plurality of substrate slits, and inorganic insulating layers provided on the resin portion, a first inorganic encapsulation film covers the plurality of inversely tapered protruding portions and the plurality of substrate slits, and a metal layer is provided on the inorganic insulating layer in at least one of the plurality of inversely tapered protruding portions.

16 Claims, 13 Drawing Sheets

18pa

DISPLAY DEVICE

TECHNICAL FIELD

The disclosure relates to a display device.

BACKGROUND ART

In recent years, as display devices replacing liquid crystal display devices, self-luminous organic ElectroLuminescence (hereinafter also referred to as "EL") display devices using organic EL elements have attracted attention. Here, for example, an organic EL display device includes a resin substrate layer, a thin film transistor (hereinafter, a Thin Film Transistor is also referred to as a "TFT") layer provided on the resin substrate layer and arrayed with TFTs, an organic EL element layer provided on the TFT layer, and a encapsulation film covering the organic EL element layer. For this organic EL display device, there has been proposed a structure in which in order to install an electronic component such as a camera, or a fingerprint sensor, for example, a non-display region having an island shape is provided inside a display region in which an image is displayed and a through-hole penetrating in a thickness direction is provided in the non-display region.

For example, PTL 1 discloses an electronic device including a display panel in which a module hole penetrating through a front face and a back face of a base substrate is provided in a display region, and an electronic module housed in the module hole.

CITATION LIST

Patent Literature

PTL 1: JP 2019-35950 A

SUMMARY

Technical Problem

Incidentally, an organic EL element includes a first electrode provided on a TFT layer, a light-emitting function layer provided on the first electrode, and a second electrode provided on the light-emitting function layer. Here, the light-emitting function layer includes a plurality of individual light-emitting function layers provided so as to correspond to a plurality of subpixels constituting a display region, and a common light-emitting function layer provided so as to be common to the plurality of subpixels. Then, in an organic EL display device in which a through-hole is provided inside the display region described above, inflow of moisture or the like through the common light-emitting function layer exposed from the through-hole may cause the common light-emitting function layer and the individual light-emitting function layers in contact with the common light-emitting function layer to deteriorate, which requires to form the common light-emitting function layer that is formed by vapor deposition around the through-hole so as to be separated into a display region side and a through-hole side. Thus, in the organic EL display device, it is proposed that an inorganic insulating film constituting the TFT layer is patterned and an annular slit is formed in a resin substrate layer around the through-hole by using the patterned inorganic insulating film to form an inversely tapered cross-sectional structure. According to the inversely tapered cross-sectional structure including the resin substrate layer and the inorganic insulating film, although the common light-emitting function layer can be formed so as to be separated into the display region side and the through-hole side, cracks may occur in an inorganic encapsulation film made of the inorganic insulating film constituting the encapsulation film around the through-hole due to the processing for forming the through-hole and a load applied thereafter, and the cracks may progress toward the display region. In this case, moisture or the like flows into the light-emitting function layer through the cracks, so that the light-emitting function layer is deteriorated to cause a display defect. Accordingly, there is room for improvement.

The disclosure has been contrived in consideration of the circumstances, an object of the disclosure is to suppress the occurrence of cracks in the inorganic encapsulation film and the progress thereof to the display region around the through-hole.

Solution to Problem

In order to achieve the above-described object, a display device according to the disclosure includes a resin substrate layer, a thin film transistor layer provided on the resin substrate layer and sequentially layered with an inorganic insulating film and a metal wiring layer, a light-emitting element layer provided on the thin film transistor layer and sequentially layered with a plurality of first electrodes, a common light-emitting function layer, and a common second electrode corresponding to a plurality of subpixels constituting a display region, and a first inorganic encapsulation film covering the light-emitting element layer, in which a non-display region having an island shape is provided inside the display region, a through-hole penetrating through the resin substrate layer in a thickness direction of the resin substrate layer is provided in the non-display region, a plurality of inversely tapered protruding portions surrounding the through-hole are provided in the non-display region, each of the plurality of inversely tapered protruding portions includes a resin portion formed of the resin substrate layer and an inorganic insulating layer provided on the resin portion and formed of a material identical to a material of the inorganic insulating film in a layer identical to a layer of the inorganic insulating film, the resin portion included in each of the plurality of inversely tapered protruding portions is separated by corresponding slits of a plurality of substrate slits, the plurality of substrate slits surrounding the through-hole on a surface on a side of the thin film transistor layer of the resin substrate layer, the inorganic insulating layer protrudes in an eaves shape toward at least one of a side of the through-hole and a side of the display region from the resin portion in each of the plurality of inversely tapered protruding portions, the first inorganic encapsulation film covers the plurality of inversely tapered protruding portions and the plurality of substrate slits in a region provided with the plurality of inversely tapered protruding portions and the plurality of substrate slits, and a metal layer formed of a material identical to a material of the metal wiring layer in a layer identical to a layer of the metal wiring layer is provided on the inorganic insulating layer in at least one of the plurality of inversely tapered protruding portions.

Advantageous Effects of Disclosure

According to the disclosure, it is possible to suppress the occurrence of cracks in the inorganic encapsulation film and the progress thereof to the display region around the through-hole.

DESCRIPTION OF EMBODIMENTS

Embodiments of a technique according to the disclosure will be described below in detail with reference to the drawings. Note that the technique according to the disclosure is not limited to the embodiments to be described below.

First Embodiment

Figure 1:
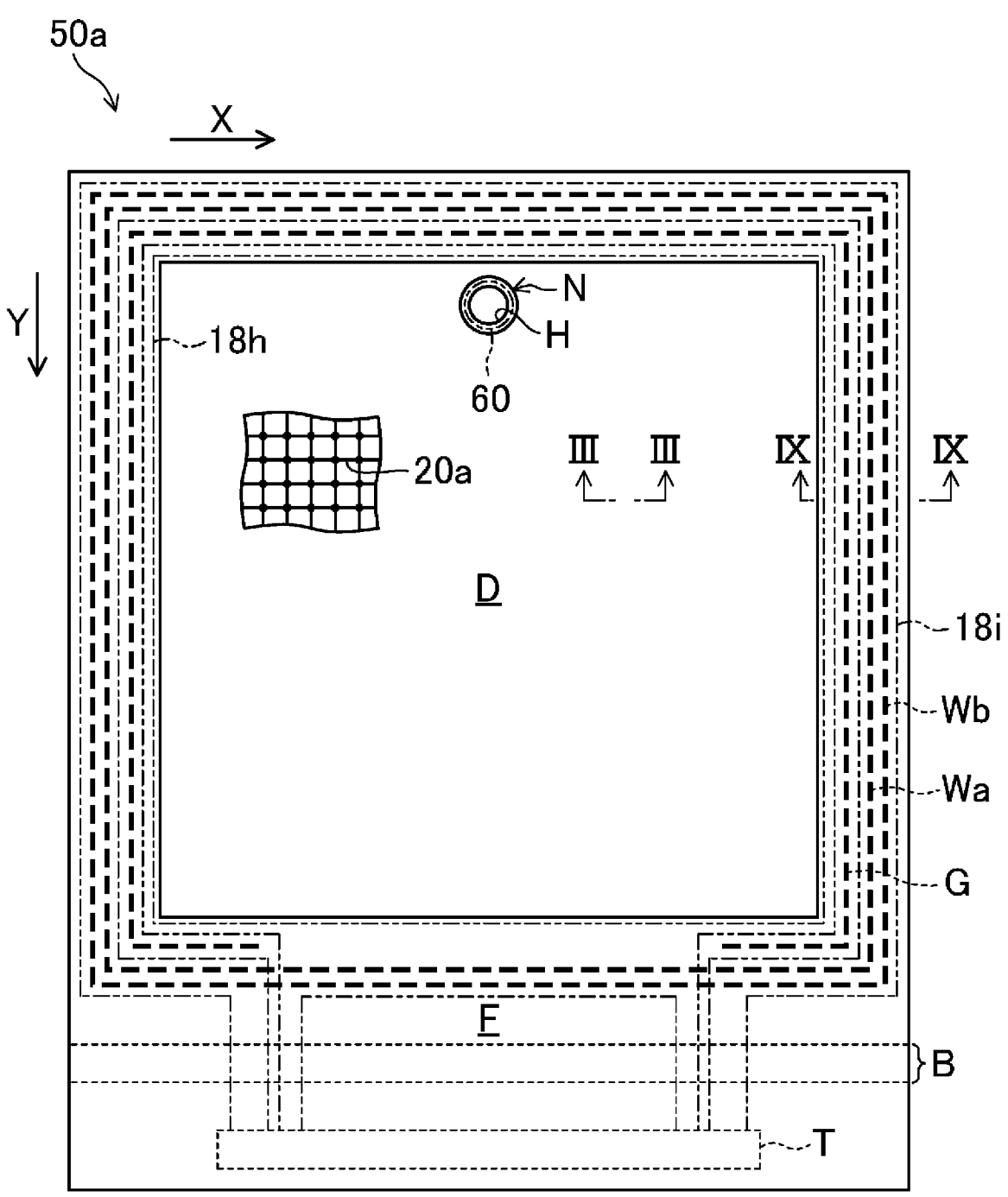
FIG. 1 is a plan view illustrating a schematic configuration of an organic EL display device according to a first embodiment of the disclosure.
Figure 2:
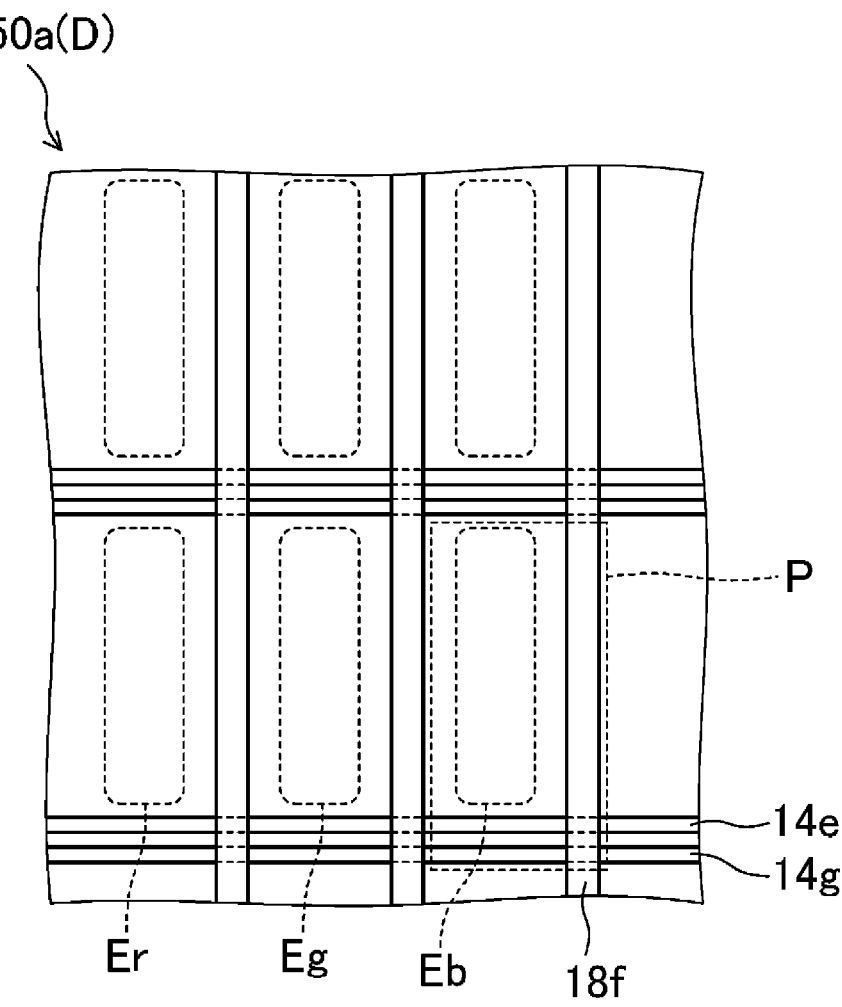
FIG. 2 is a plan view of a display region of the organic EL display device according to the first embodiment of the disclosure.
Figure 3:
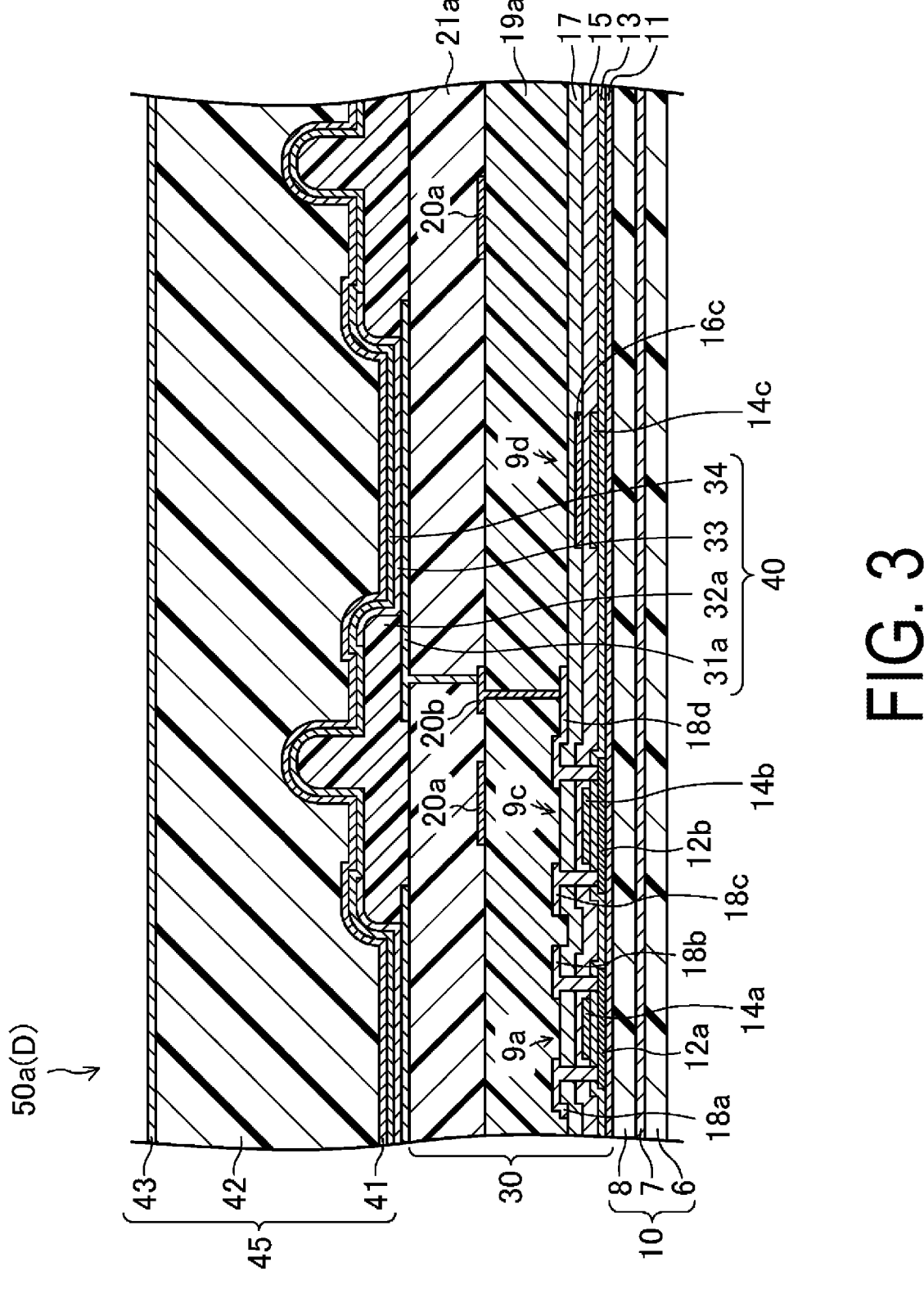
FIG. 3 is a cross-sectional view of the display region of the organic EL display device taken along a line III-III in FIG. 1.
Figure 4:
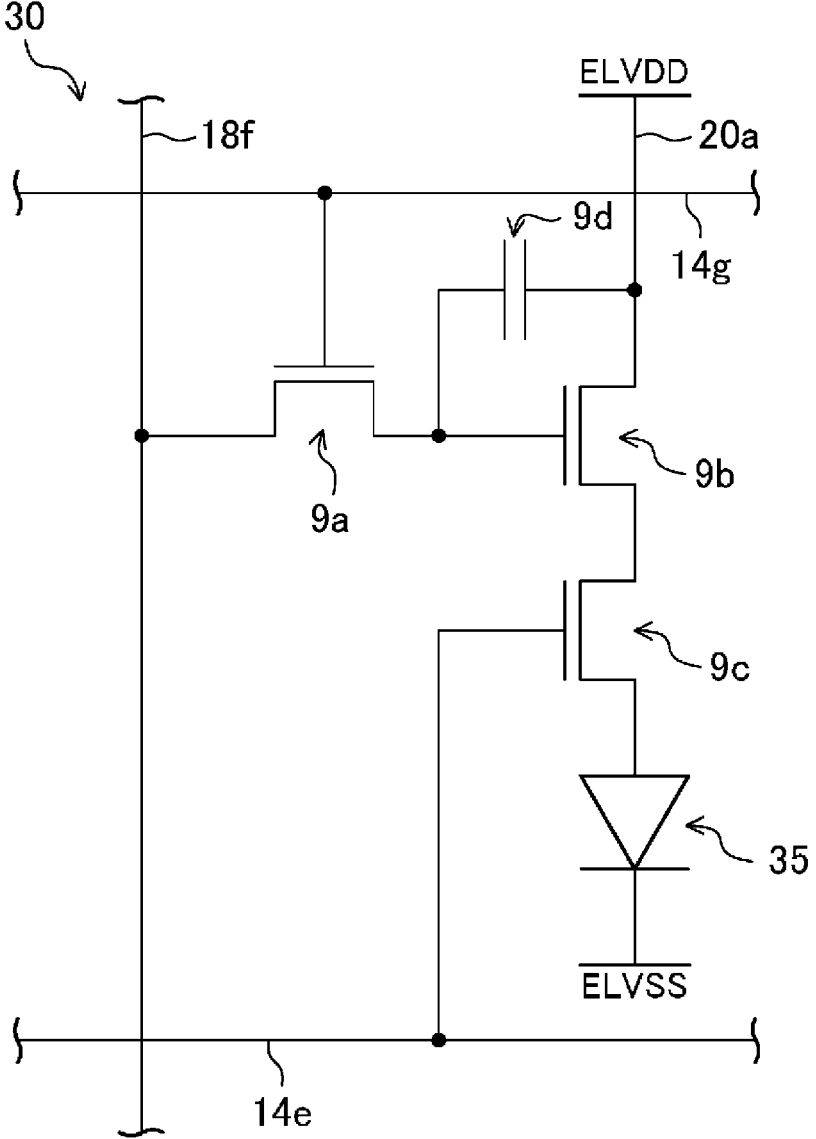
FIG. 4 is an equivalent circuit diagram of a TFT layer constituting the organic EL display device according to the first embodiment of the disclosure.
Figure 5:
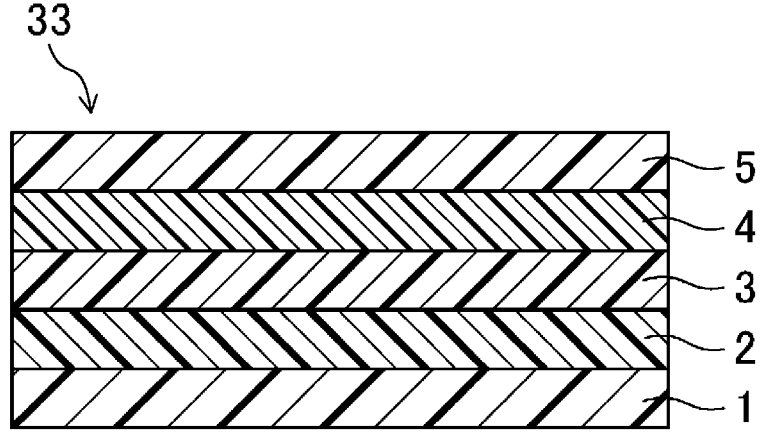
FIG. 5 is a cross-sectional view illustrating an organic EL layer constituting the organic EL display device according to the first embodiment of the disclosure.
Figure 6:
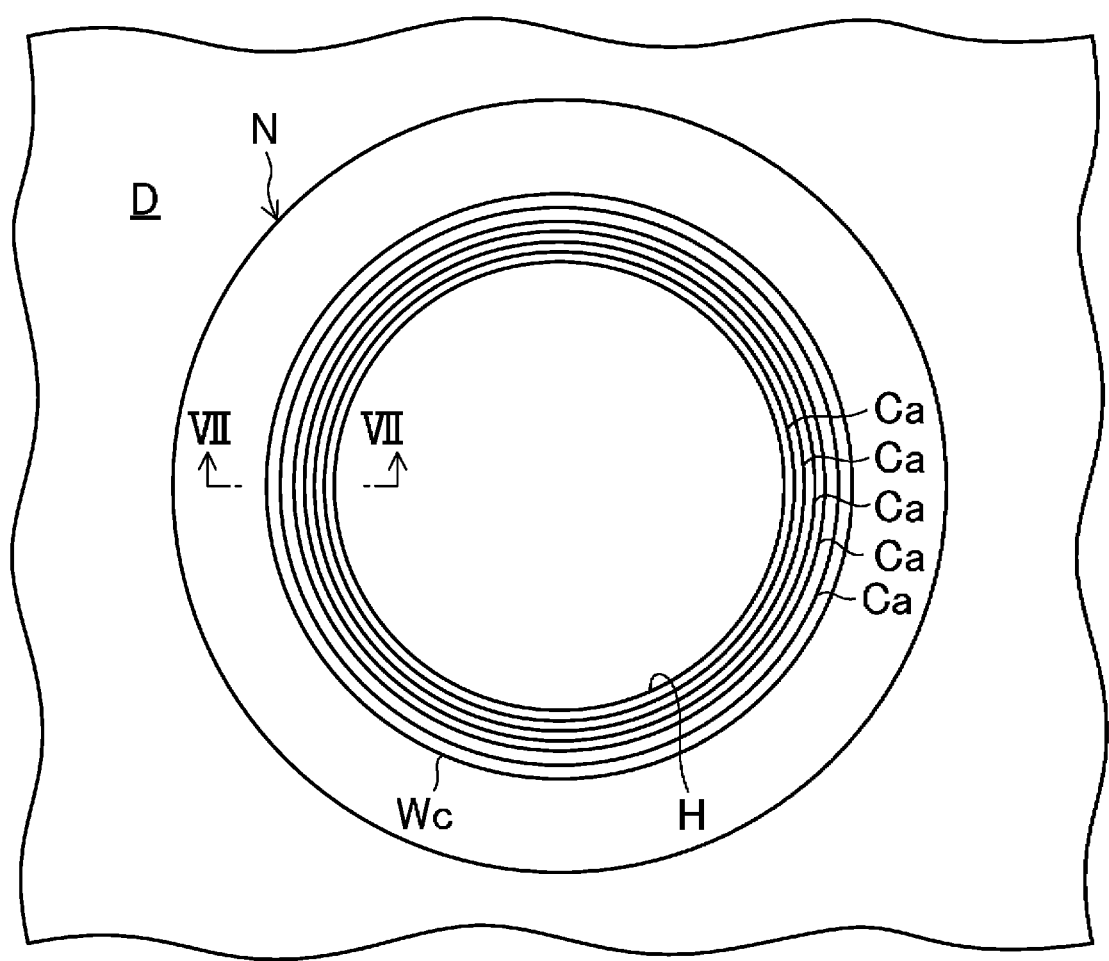
FIG. 6 is a plan view of a non-display region and the periphery of the non-display region of the organic EL display device according to the first embodiment of the disclosure.
Figure 7:
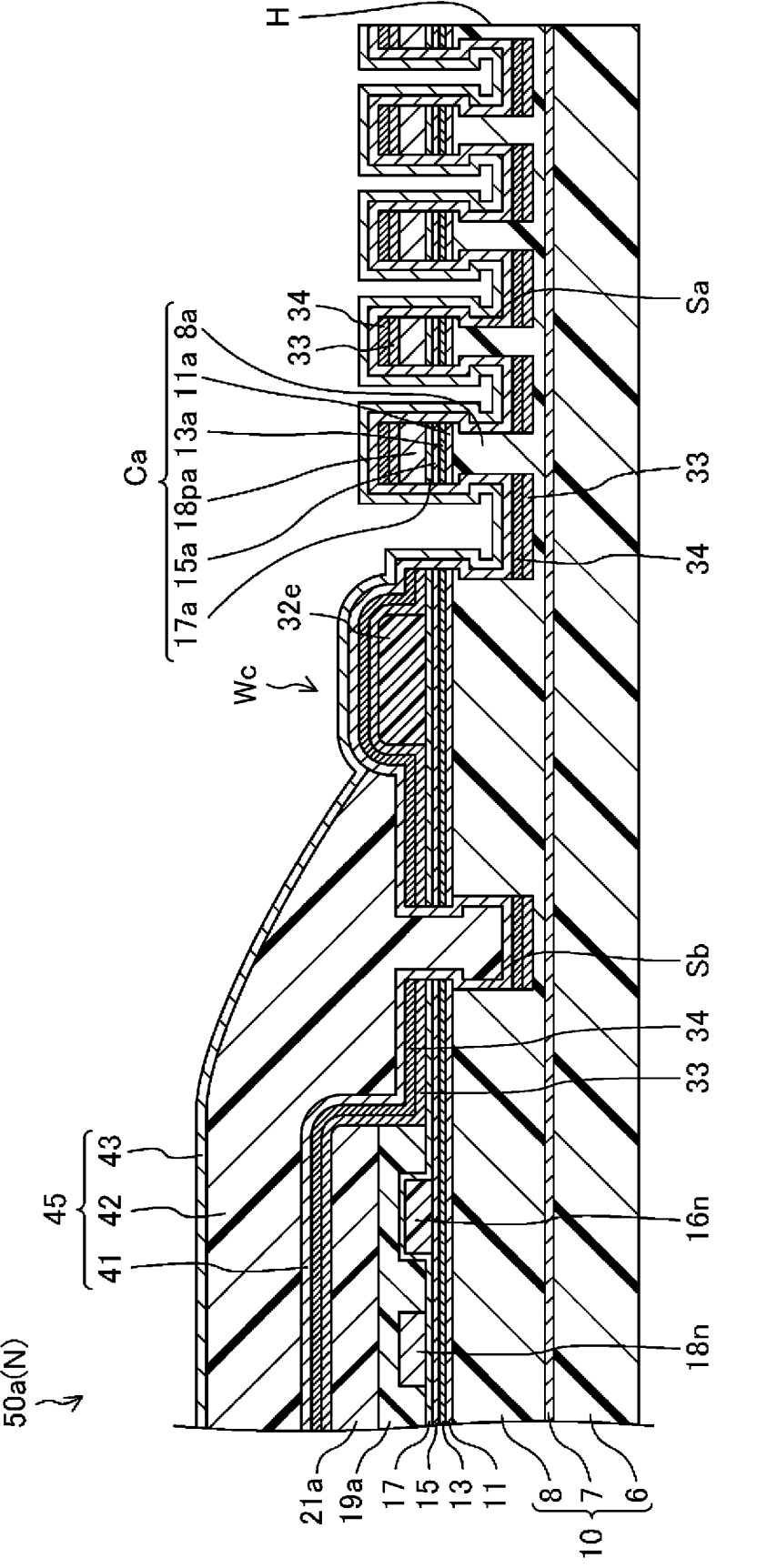
FIG. 7 is a cross-sectional view of the non-display region of the organic EL display device taken along a line VII-VII in FIG. 6.
Figure 8:
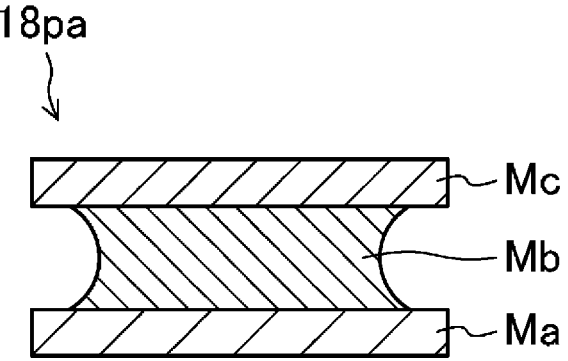
FIG. 8 is a cross-sectional view of a metal layer in an inversely tapered protruding portion constituting the organic EL display device according to the first embodiment of the disclosure.
Figure 9:
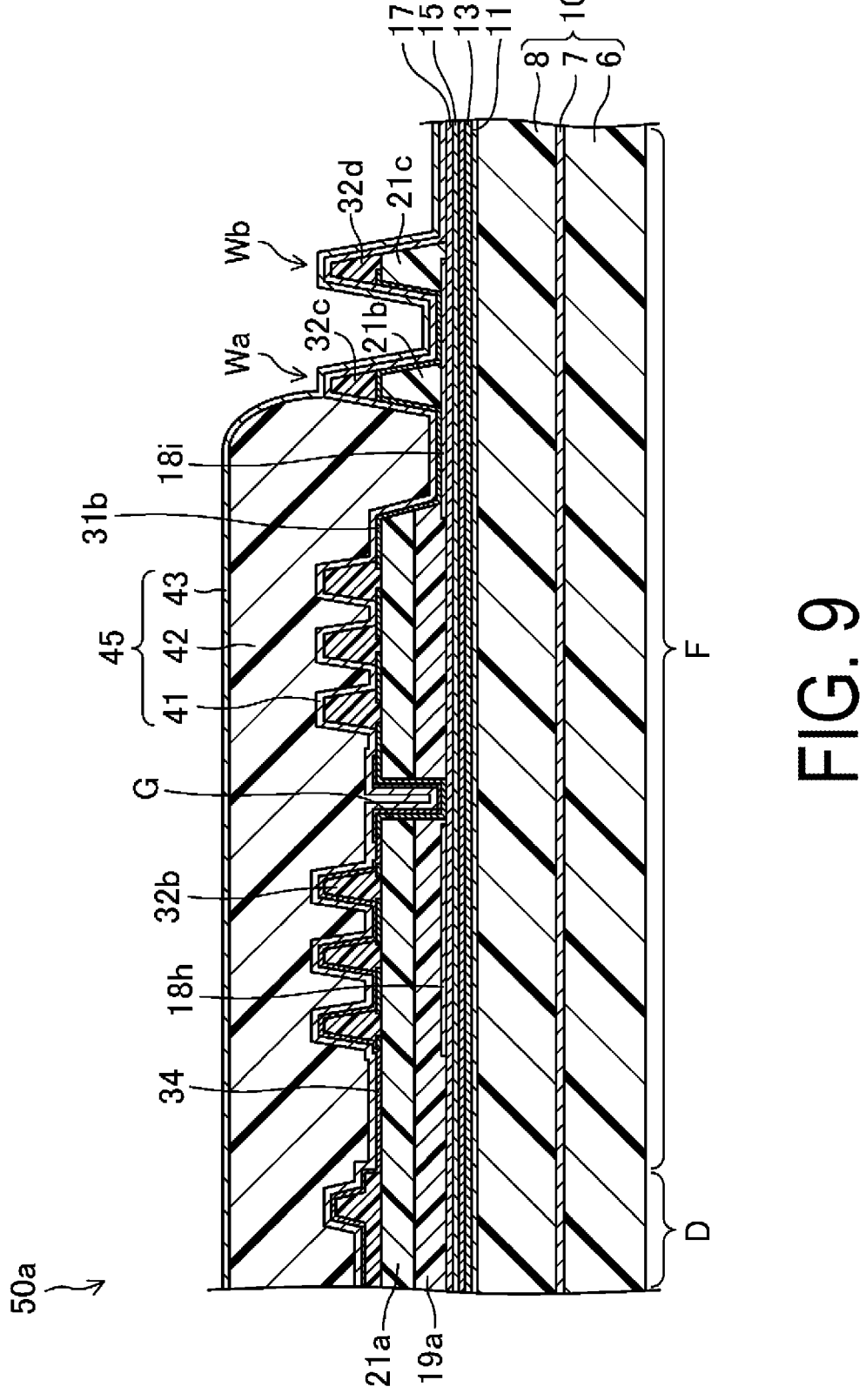
FIG. 9 is a cross-sectional view of the organic EL display device taken along a line IX-IX in FIG. 1.

FIG. 1 to FIG. 9 illustrate a first embodiment of a display device according to the disclosure. Note that, in each of the following embodiments, an organic EL display device including an organic EL element layer is exemplified as a display device including a light-emitting element layer. Here, FIG. 1 is a plan view illustrating a schematic configuration of an organic EL display device 50*a* according to the present embodiment. Further, FIG. 2 is a plan view of a display region D of the organic EL display device 50*a*. Additionally, FIG. 3 is a cross-sectional view of the display region D of the organic EL display device 50*a* taken along a line III-III in FIG. 1. Additionally, FIG. 4 is an equivalent circuit diagram of a TFT layer 30 constituting the organic EL display device 50*a*. Additionally, FIG. 5 is a cross-sectional view illustrating an organic EL layer 33 constituting the organic EL display device 50*a*. Further, FIG. 6 is a plan view of a non-display region N and the periphery of the non-display region N of the organic EL display device 50*a*. Further, FIG. 7 is a cross-sectional view of the non-display region N of the organic EL display device 50*a* taken along a line VII-VII in FIG. 6. Further, FIG. 8 is a cross-sectional view of a metal layer 18*pa* of an inversely tapered protruding portion Ca constituting the organic EL display device 50*a*. Further, FIG. 9 is a cross-sectional view of the organic EL display device 50*a* taken along a line IX-IX in FIG. 1.

As illustrated in FIG. 1, the organic EL display device 50*a* includes, for example, the display region D that is provided in a rectangular shape and in which an image is displayed, and a frame region F provided in a frame-like shape surrounding the display region D. Note that in the present embodiment, the display region D having the rectangular shape is exemplified, but the rectangular shape includes a substantial rectangular shape such as a shape whose sides are arc-shaped, a shape whose corners are arc-shaped, and a shape in which a part of a side has a notch.

As illustrated in FIG. 2, a plurality of subpixels P are arrayed in a matrix shape in the display region D. In addition, in the display region D, for example, a subpixel P including a red light-emitting region Er configured to display a red color, a subpixel P including a green light-emitting region Eg configured to display a green color, and a subpixel P including a blue light-emitting region Eb configured to display a blue color are provided adjacent to one another, as illustrated in FIG. 2. Note that one pixel is configured by, for example, the three adjacent subpixels P including the red light-emitting region Er, the green light-emitting region Eg, and the blue light-emitting region Eb in the display region D. Further, as illustrated in FIG. 1, the non-display region N is provided in an island shape inside the display region D. Here, as illustrated in FIG. 1, in the non-display region N, a through-hole H that penetrates through a resin substrate layer 10 to be described below in a thickness direction is provided in order to install an electronic component 60, such as a camera, a fingerprint sensor, a face authentication sensor or the like on a back face side.

A terminal portion T is provided at a lower end portion of the frame region F in FIG. 1 in such a manner as to extend in one direction (X direction in the drawing). Here, as illustrated in FIG. 1, in the frame region F, a bending portion B bendable, for example, by 180 degrees (in a U-shape) with the X direction in the drawing serving as a bending axis is provided between the display region D and the terminal portion T so as to extend in one direction (X direction in the drawing). Further, as illustrated in FIG. 1 and FIG. 9, in the frame region F, a first flattening film 19*a* and a second flattening film 21*a*, which will be described later, are provided with a trench G having a substantially C-shape in a plan view and penetrating through the first flattening film 19*a* and the second flattening film 21*a*. Here, as illustrated in FIG. 1, in a plan view, the trench G is provided in the substantially C-shape so as to be open on a side of the terminal portion T.

As illustrated in FIG. 3, the organic EL display device 50*a* includes the resin substrate layer 10, a TFT layer 30 provided on the resin substrate layer 10, an organic EL element layer 40 provided as a light-emitting element layer on the TFT layer 30, and a encapsulation film 45 provided in such a manner as to cover the organic EL element layer 40. Note that as illustrated in FIG. 1, in the organic EL display device 50*a*, an electronic component 60 is installed inside the through-hole H formed in the non-display region N in the display region D described above.

As illustrated in FIG. 3, FIG. 7, and FIG. 9, the resin substrate layer 10 includes a first resin substrate layer 6 provided on an opposite side to the TFT layer 30, a second resin substrate layer 8 provided on a side of the TFT layer 30, and an in-substrate inorganic insulating film 7 provided between the first resin substrate layer 6 and the second resin substrate layer 8. Each of the first resin substrate layer 6 and the second resin substrate layer 8 is made of, for example, a polyimide resin or the like. Further, each of the in-substrate inorganic insulating film 7, and a base coat film 11, a gate insulating film 13, a first interlayer insulating film 15, and a second interlayer insulating film 17, which will be described later, is made of a single-layer film or a layered film of an inorganic insulating film such as silicon nitride, silicon oxide, or silicon oxynitride.

As illustrated in FIG. 3, the TFT layer 30 includes a base coat film 11 provided on the resin substrate layer 10, a plurality of first TFTs 9*a*, a plurality of second TFTs 9*b* (see FIG. 4), a plurality of third TFTs 9*c*, and a plurality of capacitors 9*d* provided on the base coat film 11, and the first flattening film 19*a* and the second flattening film 21*a* sequentially provided on each of the first TFTs 9*a*, each of the second TFTs 9*b*, each of the third TFTs 9*c*, and each of the capacitors 9*d*.

In the TFT layer 30, as illustrated in FIG. 3, on the resin substrate layer 10, the base coat film 11, a semiconductor pattern layer such as a semiconductor layer 12*a*, which will be described later, the gate insulating film 13, a first wiring layer such as a gate line 14*g*, which will be described later, the first interlayer insulating film 15, a second wiring layer such as an upper conductive layer 16*c*, which will be described later, the second interlayer insulating film 17, a third wiring layer such as a source line 18*f*, which will be described later, the first flattening film 19*a*, a fourth wiring layer such as a power source line 20*a*, and the second flattening film 21*a* are sequentially layered.

As illustrated in FIG. 2 and FIG. 4, in the TFT layer 30, a plurality of gate lines 14*g* are provided as the first wiring layer (gate wiring layer) so as to extend parallel to each other in a horizontal direction in the drawings. In addition, in the TFT layer 30, as illustrated in FIG. 2 and FIG. 4, a plurality of light emission control lines 14*e* are provided as the first wiring layer (gate wiring layer) so as to extend parallel to each other in the horizontal direction in the drawings. Note that, as illustrated in FIG. 2, each of the light emission control lines 14*e* is provided adjacent to a corresponding one of the gate lines 14*g*. Further, in the TFT layer 30, as illustrated in FIG. 2 and FIG. 4, a plurality of source lines 18*f* are provided as the third wiring layer (metal wiring layer) in such a manner as to extend parallel to each other in a vertical direction in the drawings. Further, in the TFT layer 30, as illustrated in FIG. 1 and FIG. 3, the power source line 20*a* is provided in a lattice pattern as the fourth wiring layer between the first flattening film 19*a* and the second flattening film 21*a*. In addition, in the TFT layer 30, as illustrated in FIG. 4, each subpixel P includes the first TFT 9*a*, the second TFT 9*b*, the third TFT 9*c*, and the capacitor 9*d*.

As illustrated in FIG. 4, the first TFT 9*a* is electrically connected to the corresponding gate line 14*g*, the corresponding source line 18*f*, and the corresponding second TFT 9*b* in each subpixel P. Additionally, as illustrated in FIG. 3, the first TFT 9*a* includes a semiconductor layer 12*a*, a gate insulating film 13, a gate electrode 14*a*, a first interlayer insulating film 15, a second interlayer insulating film 17, and a source electrode 18*a* and a drain electrode 18*b*, which are sequentially provided on the base coat film 11. Here, as illustrated in FIG. 3, the semiconductor layer 12*a* is provided in an island shape on the base coat film 11, and includes a channel region, a source region, and a drain region, as will be described below. Additionally, as illustrated in FIG. 3, the gate insulating film 13 is provided so as to cover the semiconductor layer 12*a*. Additionally, as illustrated in FIG. 3, the gate electrode 14*a* is provided on the gate insulating film 13 so as to overlap with the channel region of the semiconductor layer 12*a*. Additionally, as illustrated in FIG. 3, the first interlayer insulating film 15 and the second interlayer insulating film 17 are sequentially provided so as to cover the gate electrode 14*a*. Additionally, as illustrated in FIG. 3, the source electrode 18*a* and the drain electrode 18*b* are separated from each other on the second interlayer insulating film 17. Additionally, as illustrated in FIG. 3, the source electrode 18*a* and the drain electrode 18*b* are electrically connected to the source region and the drain region of the semiconductor layer 12*a*, respectively, via each contact hole formed in a layered film including the gate insulating film 13, the first interlayer insulating film 15, and the second interlayer insulating film 17.

As illustrated in FIG. 4, the second TFT 9*b* is electrically connected to the corresponding first TFT 9*a*, the corresponding power source line 20*a*, and the corresponding third TFT 9*c* in each subpixel P. Note that the second TFT 9*b* has substantially the same structure as the first TFT 9*a* and the third TFT 9*c* to be described later.

As illustrated in FIG. 4, the third TFT 9*c* is electrically connected to the corresponding second TFT 9*b*, a first electrode 31*a* of a corresponding organic EL element 35, which will be described later, and the corresponding light emission control line 14*e* in each subpixel P. Additionally, as illustrated in FIG. 3, the third TFT 9*c* includes a semiconductor layer 12*b*, the gate insulating film 13, a gate electrode 14*b*, the first interlayer insulating film 15, the second interlayer insulating film 17, and a source electrode 18*c* and a drain electrode 18*d*, which are sequentially provided on the base coat film 11. Here, as illustrated in FIG. 3, the semiconductor layer 12*b* is provided in an island shape on the base coat film 11, and includes a channel region, a source region, and a drain region, as with the semiconductor layer 12*a*. Additionally, as illustrated in FIG. 3, the gate insulating film 13 is provided so as to cover the semiconductor layer 12*b*. Additionally, as illustrated in FIG. 3, the gate electrode 14*b* is provided on the gate insulating film 13 so as to overlap with the channel region of the semiconductor layer 12*b*. Additionally, as illustrated in FIG. 3, the first interlayer insulating film 15 and the second interlayer insulating film 17 are sequentially provided so as to cover the gate electrode 14*b*. Additionally, as illustrated in FIG. 3, the source electrode 18*c* and the drain electrode 18*d* are separated from each other on the second interlayer insulating film 17. Additionally, as illustrated in FIG. 3, the source electrode 18*c* and the drain electrode 18*d* are electrically connected to the source region and the drain region of the semiconductor layer 12*b*, respectively, via each contact hole formed in a layered film including the gate insulating film 13, the first interlayer insulating film 15, and the second interlayer insulating film 17.

Note that, in the present embodiment, the first TFT 9*a*, the second TFT 9*b*, and the third TFT 9*c* of a top gate type are exemplified, but the first TFT 9a, the second TFT 9b, and the third TFT 9c may be of a bottom gate type.

As illustrated in FIG. 4, the capacitor 9d is electrically connected to the corresponding first TFT 9a and the power source line 20a in each subpixel P. Here, the capacitor 9d includes, as illustrated in FIG. 3, a lower conductive layer 14c provided as the first wiring layer (gate wiring layer), the first interlayer insulating film 15 provided so as to cover the lower conductive layer 14c, and the upper conductive layer 16c provided, as the second wiring layer, on the first interlayer insulating film 15 so as to overlap with the lower conductive layer 14c. Note that the upper conductive layer 16c is electrically connected to the power source line 20a via a contact hole (not illustrated) formed in the second interlayer insulating film 17 and the first flattening film 19a.

Each of the first flattening film 19a and the second flattening film 21a has a flat surface in the display region D, and is formed of, for example, an organic resin material such as a polyimide resin or an acrylic resin, a polysiloxane-based Spin On Glass (SOG) material, or the like. Here, as illustrated in FIG. 3, between the first flattening film 19a and the second flattening film 21a, a relay electrode 20b is provided as the fourth wiring layer in addition to the power source line 20a described above.

The organic EL element layer 40 includes, as illustrated in FIG. 3, a plurality of first electrodes 31a, an edge cover 32a, the organic EL layer 33, and a second electrode 34 that are sequentially layered on the TFT layer 30. Here, the organic EL element 35 is constituted by the first electrode 31a, the organic EL layer 33, and the second electrode 34 that are sequentially layered on the TFT layer 30.

As illustrated in FIG. 3, the plurality of first electrodes 31a are provided in a matrix shape on the second flattening film 21a so as to correspond to the plurality of subpixels P. Here, as illustrated in FIG. 3, the first electrode 31a is electrically connected to the drain electrode 18d of the corresponding third TFT 9c via a contact hole formed in the first flattening film 19a, the relay electrode 20b, and a contact hole formed in the second flattening film 21a. Additionally, the first electrode 31a has a function to inject a hole (positive hole) into the organic EL layer 33. Additionally, the first electrode 31a is preferably formed of a material having a high work function to improve hole injection efficiency into the organic EL layer 33. Here, examples of the material constituting the first electrode 31a include metal materials such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), tin (Sn) and the like. Examples of the material constituting the first electrode 31a may also include an alloy such as astatine (At)/astatine oxide (AtO$_2$). Further, examples of the material constituting the first electrode 31a may include an electrically conductive oxide such as tin oxide (SnO), zinc oxide (ZnO), indium tin oxide (ITO), indium zinc oxide (IZO) and the like. Additionally, the first electrode 31a may be formed by layering a plurality of layers including any of the materials described above. Note that examples of compound materials having a high work function include indium tin oxide (ITO) and indium zinc oxide (IZO).

As illustrated in FIG. 3, the edge cover 32a is provided in a lattice pattern, and covers peripheral edge portions of the respective first electrodes 31a. Here, the edge cover 32a is formed of, for example, an organic resin material such as a polyimide resin or an acrylic resin, a polysiloxane-based SOG material, or the like.

As illustrated in FIG. 3, the organic EL layer 33 is disposed on each first electrode 31a, and includes individual light-emitting function layers provided in a matrix shape in such a manner as to correspond to the plurality of subpixels P, and a common light-emitting function layer provided for the plurality of subpixels P in common. Here, as illustrated in FIG. 5, the organic EL layer 33 includes a hole injection layer 1, a hole transport layer 2, an organic light-emitting layer 3, an electron transport layer 4, and an electron injection layer 5, which are sequentially provided on the first electrode 31a. Note that in the present embodiment, the organic EL layer 33 in which the organic light-emitting layer 3 is provided as the individual light-emitting function layer and the hole injection layer 1, the hole transport layer 2, the electron transport layer 4, and the electron injection layer 5 are provided as the common light-emitting function layer is exemplified. However, color conversion may be performed by a Quantum-dot Light Emitting Diode (QLED) or the like to make the organic light-emitting layer 3 function as the common light-emitting function layer and to make at least one of the hole injection layer 1, the hole transport layer 2, the electron transport layer 4, and the electron injection layer 5 function as the individual light-emitting function layer.

The hole injection layer 1 is also referred to as an anode buffer layer, has a function of bringing energy levels of the first electrode 31a and the organic EL layer 33 close to each other to improve hole injection efficiency from the first electrode 31a into the organic EL layer 33, and is provided as the common light-emitting function layer that is common to the plurality of subpixels P. Here, examples of a material constituting the hole injection layer 1 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, and stilbene derivatives.

The hole transport layer 2 has a function of improving hole transport efficiency from the first electrode 31a to the organic EL layer 33, and is provided as the common light-emitting function layer that is common to the plurality of subpixels P. Here, examples of a material constituting the hole transport layer 2 include porphyrin derivatives, aromatic tertiary amine compounds, styrylamine derivatives, polyvinylcarbazole, poly-p-phenylenevinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, and zinc selenide.

The organic light-emitting layer 3 is a region where, when a voltage is applied by the first electrode 31a and the second electrode 34, positive holes and electrons are injected from the first electrode 31a and the second electrode 34, respectively, and the positive holes and the electrons are recombined. In addition, the organic light-emitting layer 3 is provided as the individual light-emitting function layer in a manner as to correspond to the plurality of subpixels P. Here, the organic light-emitting layer 3 is formed of a material having high luminous efficiency. Moreover, examples of the material constituting the organic light-emitting layer 3 include metal oxinoid compounds [8-hydroxyquinoline metal complexes], naphthalene derivatives, anthracene derivatives, diphenylethylene derivatives, vinyl acetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, trisstyrylbenzene derivatives, perylene derivatives, perinone derivatives, aminopyrene derivatives, pyridine derivatives, rhodamine derivatives, aquidine derivatives, phenoxazone, quinacridone derivatives, rubrene, poly-p-phenylenevinylene, and polysilane.

The electron transport layer 4 has a function of efficiently moving electrons to the organic light-emitting layer 3, and is provided as the common light-emitting function layer that is common to the plurality of subpixels P. Here, examples of a material constituting the electron transport layer 4 include oxadiazole derivatives, triazole derivatives, benzoquinone derivatives, naphthoquinone derivatives, anthraquinone derivatives, tetracyanoanthraquinodimethane derivatives, diphenoquinone derivatives, fluorenone derivatives, silole derivatives, and metal oxinoid compounds, as organic compounds.

The electron injection layer 5 functions to reduce an energy level difference between the second electrode 34 and the organic EL layer 33 to thereby improve the efficiency of electron injection into the organic EL layer 33 from the second electrode 34, and this function allows the drive voltage of the organic EL element 35 to be reduced. Note that the electron injection layer 5 is also referred to as a cathode buffer layer, and is provided as the common light-emitting function layer that is common to the plurality of subpixels P. Here, examples of a material constituting the electron injection layer 5 include inorganic alkaline compounds, such as lithium fluoride (LiF), magnesium fluoride ($MgF_2$), calcium fluoride ($CaF_2$), strontium fluoride ($SrF_2$), and barium fluoride ($BaF_2$), aluminum oxide ($Al_2O_3$), and strontium oxide (SrO).

The second electrode 34 is provided on a plurality of the organic EL layers 33 so as to be common to the plurality of subpixels P, that is, the second electrode 34 is provided to cover the organic EL layer 33 and the edge cover 32a, as illustrated in FIG. 3. Further, the second electrode 34 functions to inject electrons into the organic EL layer 33. Further, the second electrode 34 is preferably formed of a material having a low work function to improve the efficiency of electron injection into the organic EL layer 33. Here, examples of a material constituting the second electrode 34 include silver (Ag), aluminum (Al), vanadium (V), calcium (Ca), titanium (Ti), yttrium (Y), sodium (Na), manganese (Mn), indium (In), magnesium (Mg), lithium (Li), ytterbium (Yb), and lithium fluoride (LiF). Further, the second electrode 34 may be formed of an alloy such as magnesium (Mg)/copper (Cu), magnesium (Mg)/silver (Ag), sodium (Na)/potassium (K), astatine (At)/astatine oxide ($AtO_2$), lithium (Li)/aluminum (Al), lithium (Li)/calcium (Ca)/aluminum (Al), and lithium fluoride (LiF)/calcium (Ca)/aluminum (Al). Further, the second electrode 34 may be formed of an electrically conductive oxide such as tin oxide (SnO), zinc oxide (ZnO), indium tin oxide (ITO), and indium zinc oxide (IZO). Further, the second electrode 34 may be formed by layering a plurality of layers formed of any of the materials described above. Note that examples of the material having the low work function include magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/ aluminum (Al), and lithium fluoride (LiF)/calcium (Ca)/ aluminum (Al).

As illustrated in FIG. 3, the encapsulation film 45 is provided to cover the second electrode 34, includes a first inorganic encapsulation film 41, an organic encapsulation film 42, and a second inorganic encapsulation film 43 that are sequentially layered on the second electrode 34, and has a function to protect the organic EL layer 33 of the organic EL element 35 from moisture and oxygen. Here, the first inorganic encapsulation film 41 and the second inorganic encapsulation film 43 include, for example, an inorganic insulating film such as a silicon nitride film, a silicon oxide film, and a silicon oxynitride film. Additionally, the organic encapsulation film 42 is made of, for example, an organic resin material such as an acrylic resin, an epoxy resin, a silicone resin, a polyurea resin, a parylene resin, a polyimide resin, or a polyamide resin. Note that in the present embodiment, the encapsulation film 45 having a three-layer structure in which the first inorganic encapsulation film 41, the organic encapsulation film 42, and the second inorganic encapsulation film 43 are sequentially layered is exemplified. However, the encapsulation film 45 may have a single-layer structure including only the first inorganic encapsulation film 41, a two-layer structure in which the first inorganic encapsulation film 41 and the organic encapsulation film 42 are sequentially layered, or the like.

Additionally, as illustrated in FIG. 6 and FIG. 7, the organic EL display device 50a includes a plurality of inversely tapered protruding portions Ca each of which is provided concentrically and annularly so as to surround the through-hole H in the non-display region N.

As illustrated in FIG. 7, each of the inversely tapered protruding portions Ca includes the resin portion 8a constituted by the second resin substrate layer 8 of the resin substrate layer 10, a first inorganic insulating layer 11a, a second inorganic insulating layer 13a, a third inorganic insulating layer 15a, and a fourth inorganic insulating layer 17a that are sequentially provided on the resin portion 8a, and a metal layer 18pa provided on the fourth inorganic insulating layer 17a. Here, the metal layer 18pa may be provided on the second inorganic insulating layer 13a without the third inorganic insulating layer 15a and the fourth inorganic insulating layer 17a, or may be provided on the first inorganic insulating layer 11a without the second inorganic insulating layer 13a, the third inorganic insulating layer 15a, and the fourth inorganic insulating layer 17a. Note that in the present embodiment, the configuration in which the metal layer 18pa is provided on the fourth inorganic insulating layer 17a in each of the inversely tapered protruding portions Ca is exemplified, but the metal layer 18pa may be provided in at least one of the plurality of inversely tapered protruding portions Ca. Additionally, as illustrated in FIG. 7, the organic EL layer 33 and the second electrode 34 are separated from those in the display region D and sequentially layered on each of the inversely tapered protruding portions Ca.

As illustrated in FIG. 7, the resin portion 8a is separated by a plurality of substrate slits Sa each of which is formed concentrically and annularly on a surface of the second resin substrate layer 8 on a side of the TFT layer 30 so as to surround the through-hole H. Note that at a bottom portion of each substrate slit Sa, as illustrated in FIG. 7, the organic EL layer 33 and the second electrode 34 are separated from those in the display region D and sequentially layered.

The first inorganic insulating layer 11a, the second inorganic insulating layer 13a, the third inorganic insulating layer 15a, and the fourth inorganic insulating layer 17a are formed of identical materials in identical layers to those of the base coat film 11, the gate insulating film 13, the first interlayer insulating film 15, and the second interlayer insulating film 17, respectively. Here, as illustrated in FIG. 7, in each of the inversely tapered protruding portions Ca, the first inorganic insulating layer 11a, the second inorganic insulating layer 13a, the third inorganic insulating layer 15a, and the fourth inorganic insulating layer 17a are provided so as to protrude from a base portion of the resin portion 8a to the through-hole H side and the display region D side in an eaves shape. Note that in the present embodiment, the configuration is exemplified in which the first inorganic insulating layer 11a, the second inorganic insulating layer 13a, the third inorganic insulating layer 15a, and the fourth inorganic insulating layer 17a protrude from the resin portion 8a in an eaves shape to both the through-hole H side and the display region D side. However, the first inorganic insulating layer 11a, the second inorganic insulating layer 13a, the third inorganic insulating layer 15a, and the fourth inorganic insulating layer 17a may protrude from the resin portion 8a in an eaves shape to either the through-hole H side or the display region D side. According to this configuration, since each of the inversely tapered protruding portions Ca has an inversely tapered structure in the non-display region N, the common organic EL layer 33 and second electrode 34 are formed so as to be separated into the display region D side and the through-hole H side by a step by the inversely tapered structure having the eaves shape.

The metal layer 18pa is formed of an identical material in an identical layer to those of the third wiring layer constituted by the source line 18f or the like, and is provided to have a width of about 3 $\mu$m to 20 $\mu$m, for example. Further, as illustrated in FIG. 8, the metal layer 18pa includes a first metal layer Ma, a second metal layer Mb, and a third metal layer Mc that are sequentially layered on the fourth inorganic insulating layer 17a. Here, in the metal layer 18pa, as illustrated in FIG. 8, an inner peripheral edge portion and an outer peripheral edge portion of the first metal layer Ma and an inner peripheral edge portion and an outer peripheral edge portion of the third metal layer Mc protrude in eaves shapes with respect to an inner peripheral edge portion and an outer peripheral edge portion of the second metal layer Mb. Then, the first metal layer Ma and the third metal layer Mc are formed of, for example, a titanium-based metal film such as a titanium film or a titanium alloy film. Further, the metal layer Mb is formed of, for example, an aluminum-based metal film such as an aluminum film or an aluminum alloy film. Note that although the metal layer 18pa formed of the identical material in the identical layer to those of the third wiring layer is exemplified in the present embodiment, the metal layer may be formed of an identical material in an identical layer to those of the first wiring layer, the second wiring layer, or the fourth wiring layer.

As illustrated in FIG. 7, the above-described encapsulation film 45 is formed by layering the second inorganic encapsulation film 43 on the first inorganic encapsulation film 41 in a region where the plurality of inversely tapered protruding portions Ca and the plurality of substrate slits Sa are disposed. Here, as illustrated in FIG. 7, the layered film of the first inorganic encapsulation film 41 and the second inorganic encapsulation film 43 is provided so as to cover the plurality of inversely tapered protruding portions Ca and the plurality of substrate slits Sa.

Additionally, as illustrated in FIG. 7, in the non-display region N, the organic EL display device 50a includes an outer substrate slit Sb provided concentrically and annularly on a surface of the second resin substrate layer 8 on the TFT layer 30 side so as to surround the plurality of substrate slits Sa. Here, as illustrated in FIG. 7, the base coat film 11, the gate insulating film 13, the first interlayer insulating film 15, and the second interlayer insulating film 17 are separated by the outer substrate slit Sb, and are provided so as to protrude toward an inner side of the outer substrate slit Sb in an eaves shape. Then, as illustrated in FIG. 7, the outer substrate slit Sb is filled with the organic encapsulation film 42 with the first inorganic encapsulation film 41 therebetween.

Additionally, as illustrated in FIG. 7, the organic EL display device 50a includes, in the non-display region N, an inner dam wall We annularly provided between the plurality of substrate slits Sa and the outer substrate slit Sb. Here, as illustrated in FIG. 7, the inner dam wall We includes a resin layer 32e formed of an identical material in an identical layer to those of the edge cover 32a, is provided so as to be in contact with an inner peripheral edge portion of the organic encapsulation film 42 with the first inorganic encapsulation film 41 between the inner dam wall We and the inner peripheral edge portion of the organic encapsulation film 42, and is configured to suppress the spread of ink corresponding to the organic encapsulation film 42.

In addition, in the organic EL display device 50a, as illustrated in FIG. 7, in the non-display region N, a first bypass wiring line 16n and a second bypass wiring line 18n that bypass the through-hole H are provided around the outer substrate slit Sb. Here, the first bypass wiring line 16n is formed of an identical material in an identical layer to those of the second wiring layer. In addition, the second bypass wiring line 18n is formed of an identical material in an identical layer to those of the third wiring layer. Note that the first bypass wiring line 16n and the second bypass wiring line 18n are electrically connected to display wiring lines (the gate line 14g, the light emission control line 14e, the source line 18f, and the like) extending to a portion corresponding to the through-hole H.

Additionally, as illustrated in FIG. 1, the organic EL display device 50a includes, in the frame region F, a first outer dam wall Wa provided in a frame-like shape outside the trench G so as to surround the display region D and a second outer dam wall Wb provided in a frame-like shape around the first outer dam wall Wa.

As illustrated in FIG. 9, the first outer dam wall Wa includes a lower-side resin layer 21b formed of an identical material in an identical layer to those of the second flattening film 21a, and an upper-side resin layer 32c that is provided on the lower-side resin layer 21b through a connection wiring line 31b and that is formed of an identical material in an identical layer to those of the edge cover 32a. Here, the connection wiring line 31b is formed of an identical material in an identical layer to those of the first electrode 31a. Note that the first outer dam wall Wa is provided so as to overlap with a peripheral edge portion of the organic encapsulation film 42, and is configured to suppress the spread of ink corresponding to the organic encapsulation film 42.

As illustrated in FIG. 9, the second outer dam wall Wb includes a lower-side resin layer 21c formed of an identical material in an identical layer to those of the second flattening film 21a and an upper-side resin layer 32d that is provided on the lower-side resin layer 21c with the connection wiring line 31b interposed therebetween and that is formed of an identical material in an identical layer to those of the edge cover 32a.

In addition, as illustrated in FIG. 1, the organic EL display device 50a includes, in the frame region F, a first frame wiring line 18h provided in a frame-like shape as the third wiring layer inside the trench G, with both end portions extending to the terminal portion T at the opening portion of the trench G. Here, the first frame wiring line 18h is electrically connected to the power source line 20a in the display region D through a contact hole formed in the first flattening film 19a, and is configured so that a high power supply voltage (ELVDD) is input at the terminal portion T.

In addition, as illustrated in FIG. 1, the organic EL display device 50a includes, in the frame region F, a second frame wiring line 18i provided in a substantially C-shape as the third wiring layer outside the trench G, with both end portions extending to the terminal portion T. Here, as illustrated in FIG. 9, the second frame wiring line 18i is electrically connected to the second electrode 34 in the display region D through the connection wiring line 31b provided in the trench G, and is configured so that a low power supply voltage (ELVSS) is input at the terminal portion T.

Further, as illustrated in FIG. 9, the organic EL display device 50a includes a plurality of peripheral photo spacers 32b provided in island shapes so as to protrude upward at both edge portions of the trench G in the frame region F. Here, the peripheral photo spacer 32b is formed of the identical material in the identical layer to those of the edge cover 32a.

In the organic EL display device 50a described above, in each of the subpixels P, by inputting a gate signal to the first TFT 9a through the gate line 14g, the first TFT 9a is turned on. When a predetermined voltage corresponding to a source signal is written to a gate electrode of the second TFT 9b and the capacitor 9d through the source line 18f, and a light emission control signal is input to the third TFT 9c through the light emission control line 14e, the third TFT 9c is turned on. Then, by supplying a current corresponding to the gate voltage of the second TFT 9b from the power source line 20a to the organic EL layer 33, the organic light-emitting layer 3 of the organic EL layer 33 emits light to display an image. Note that, in the organic EL display device 50a, even when the first TFT 9a is turned off, the gate voltage of the second TFT 9b is held by the capacitor 9d, and thus, light emission by the organic light-emitting layer 3 is maintained in each of the subpixels P until a gate signal of the next frame is input.

Next, a method for manufacturing the organic EL display device 50a according to the present embodiment will be described. Note that the method for manufacturing the organic EL display device 50a according to the present embodiment includes a TFT layer forming step, an organic EL element layer forming step, a encapsulation film forming step, and a through-hole forming step.

TFT Layer Forming Step

First, for example, a non-photosensitive polyimide resin (having a thickness of approximately 6 μm) is applied onto a glass substrate, and then the applied film is prebaked and postbaked to form the first resin substrate layer 6.

Subsequently, an inorganic insulating film (with a thickness of approximately 500 nm) such as a silicon oxide film is formed on a surface of the substrate on which the first resin substrate layer 6 is formed, for example, by a plasma Chemical Vapor Deposition (CVD) method, thereby forming the in-substrate inorganic insulating film 7.

Further, for example, a non-photosensitive polyimide resin (with a thickness of approximately 6 μm) is applied onto the surface of the substrate on which the in-substrate inorganic insulating film 7 is formed, and then, the applied film is prebaked and postbaked, thereby forming the second resin substrate layer 8 to form the resin substrate layer 10.

After that, a silicon oxide film (with a thickness of approximately 500 nm) and a silicon nitride film (with a thickness of approximately 100 nm) are sequentially formed, for example, by a plasma CVD method, on the surface of the substrate on which the resin substrate layer 10 is formed, to form the base coat film 11.

Subsequently, for example, an amorphous silicon film (with a thickness of approximately 50 nm) is formed on the surface of the substrate on which the base coat film 11 is formed, by a plasma CVD method, the formed amorphous silicon film is crystallized by laser anneal or the like to form a semiconductor film of a polysilicon film, and then, the formed semiconductor film is patterned to form a semiconductor pattern layer such as the semiconductor layer 12a.

Thereafter, an inorganic insulating film (approximately 100 nm) such as a silicon oxide film is formed on the surface of the substrate on which the semiconductor pattern layer is formed, for example, by a plasma CVD method, to form the gate insulating film 13 so as to cover the semiconductor layer 12a and the like.

Furthermore, a molybdenum film (with a thickness of about 250 nm) is formed, by, for example, a sputtering method, on the surface of the substrate on which the gate insulating film 13 is formed. Then, the molybdenum film is patterned to form the first wiring layer including, for example, the gate line 14g and the like.

Subsequently, by using the first wiring layer as a mask, impurity ions are doped to form an intrinsic region and a conductor region in the semiconductor pattern layer.

Thereafter, a silicon nitride film (with a thickness of about 100 nm) is formed, for example, by a plasma CVD method, on the surface of the substrate on which the intrinsic region and the conductor region in the semiconductor pattern layer are formed, to form the first interlayer insulating film 15.

Subsequently, a molybdenum film (with a thickness of approximately 250 nm) is formed, for example, by a sputtering method, on the surface of the substrate on which the first interlayer insulating film 15 is formed, and then, the formed molybdenum film is patterned to form the second wiring layer including the upper conductive layer 16c and the like.

Furthermore, a silicon oxide film (with a thickness of about 300 nm) and a silicon nitride film (with a thickness of about 200 nm) are sequentially formed, for example, by a plasma CVD method, on the surface of the substrate on which the second wiring layer is formed, thereby forming the second interlayer insulating film 17.

Thereafter, the gate insulating film 13, the first interlayer insulating film 15, and the second interlayer insulating film 17 are patterned to form a contact hole.

Further, at the bending portion B, a layered film of the base coat film 11, the gate insulating film 13, the first interlayer insulating film 15, and the second interlayer insulating film 17 is removed to form a linear slit in the layered film of the base coat film 11, the gate insulating film 13, the first interlayer insulating film 15, and the second interlayer insulating film 17.

Subsequently, a titanium film (with a thickness of approximately 50 nm), an aluminum film (with a thickness of approximately 600 nm), and a titanium film (with a thickness of approximately 50 nm) are sequentially formed on the surface of the substrate on which the linear slit is formed, for example, by a sputtering method, and then, a metal layered film thereof is patterned to form the third wiring layer including the source line 18f and the like.

Furthermore, a photosensitive polyimide resin (with a thickness of about 2.5 μm) is applied, for example, by a spin coating method or a slit coating method, onto the surface of the substrate on which the third wiring layer is formed, and then, the applied film is prebaked, exposed, developed, and postbaked to form the first flattening film 19a and the like.

Thereafter, a titanium film (with a thickness of approximately 50 nm), an aluminum film (with a thickness of approximately 600 nm), and a titanium film (with a thickness of approximately 50 nm) are sequentially formed on the surface of the substrate on which the first flattening film 19a and the like are formed, for example, by a sputtering method, and then, a metal layered film thereof is patterned to form the fourth wiring layer including the power source line 20a and the like.

Finally, a photosensitive polyimide-based resin film (with a thickness of approximately 2.5 μm) is applied onto the surface of the substrate on which the fourth wiring layer is formed, for example, by a spin coating method or slit coating method, and then, the applied film is prebaked, exposed, developed, and postbaked, thereby forming the second flattening film 21a and the like.

As described above, the TFT layer 30 can be formed.

Organic EL Element Layer Forming Step

On the second flattening film 21a of the TFT layer 30 formed in the TFT layer forming step described above, the first electrode 31a, the edge cover 32a, the organic EL layer 33 (the hole injection layer 1, the hole transport layer 2, the organic light-emitting layer 3, the electron transport layer 4, and the electron injection layer 5), and the second electrode 34 are formed by using a well-known method to form the organic EL element layer 40. Here, after forming the first electrodes 31a, in the non-display region N, a layered film of the base coat film 11, the gate insulating film 13, the first interlayer insulating film 15, the second interlayer insulating film 17, and the third wiring layer is partially removed, and the second resin substrate layer 8 exposed from the layered film of the base coat film 11, the gate insulating film 13, the first interlayer insulating film 15, the second interlayer insulating film 17, and the third wiring layer is ashed to form the substrate slits Sa and the outer substrate slit Sb, thereby forming the inversely tapered protruding portions Ca. Note that although the manufacturing method in which the inversely tapered protruding portions Ca are formed in the organic EL element layer forming step has been exemplified in the present embodiment, the inversely tapered protruding portions Ca may be formed in the TFT layer forming step.

Sealing Film Forming Step

First, an inorganic insulating film such as a silicon nitride film, a silicon oxide film, or a silicon oxynitride film is formed by a plasma CVD method on the surface of the substrate formed with the organic EL element layer 40 formed in the organic EL element layer forming step described above by using a mask to form the first inorganic encapsulation film 41.

Next, on the surface of the substrate formed with the first inorganic encapsulation film 41, a film made of an organic resin material such as an acrylic resin is formed, for example, by an ink-jet method to form the organic encapsulation film 42.

After that, the inorganic insulating film such as a silicon nitride film, a silicon oxide film, or a silicon oxynitride film is formed by a plasma CVD method on the surface of the substrate formed with the organic encapsulation film 42 by using a mask to form the second inorganic encapsulation film 43, thereby forming the encapsulation film 45.

Furthermore, after a protective sheet (not illustrated) on the surface side is adhered to the surface of the substrate on which the encapsulation film 45 is formed, the glass substrate is peeled off from the lower face of the resin substrate layer 10 by irradiating laser light from the glass substrate side of the resin substrate layer 10, and further, a protective sheet (not illustrated) on the back face side is adhered to the lower face of the resin substrate layer 10 from which the glass substrate has been peeled off.

Through-Hole Forming Step

In the non-display region N, on the resin substrate layer 10 from which the glass substrate has been peeled off in the encapsulation film forming step, for example, laser light is emitted while annular scanning is being performed to form the through-hole H. Thereafter, when the organic EL display device 50a with the through-hole H formed is fixed, for example, to the inside of a housing, the electronic component 60 is installed so that the electronic component 60, such as a camera, is disposed on the back face side of the through-hole H.

Thus, the organic EL display device 50a of the present embodiment can be manufactured as described above.

As described above, according to the organic EL display device 50a of the present embodiment, in each of the inversely tapered protruding portions Ca, the metal layer 18pa is provided on the layered body of the first inorganic insulating layer 11a, the second inorganic insulating layer 13a, the third inorganic insulating layer 15a, and the fourth inorganic insulating layer 17a. Here, since the metal layer 18pa has ductility, the metal layer 18pa can absorb more impact from the outside as compared with the inorganic insulating films constituting the first inorganic encapsulation film 41 and the second inorganic encapsulation film 43. Accordingly, since the occurrence and progress of cracks in the first inorganic encapsulation film 41 and the second inorganic encapsulation film 43 can be suppressed, the occurrence of cracks in the first inorganic encapsulation film 41 and the second inorganic encapsulation film 43 and the progress of the cracks to the display region D can be suppressed around the through-hole H. Then, since the progress of the cracks to the display region D in the first inorganic encapsulation film 41 and the second inorganic encapsulation film 43 is suppressed, inflow of moisture or the like to the organic EL layer 33 can be suppressed, which can suppress a display defect due to deterioration of the organic EL layer 33.

In addition, according to the organic EL display device 50a of the present embodiment, in the metal layer 18pa, the peripheral edge portions of the first metal layer Ma and the third metal layer Mc protrude in the eave shapes with respect to the peripheral edge portion of the second metal layer Mb. Thus, film peeling of the encapsulation film 45 can be suppressed by an anchoring effect of the inversely tapered structure constituted by the first metal layer Ma, the second metal layer Mb, and the third metal layer Mc.

Second Embodiment

Figure 10:
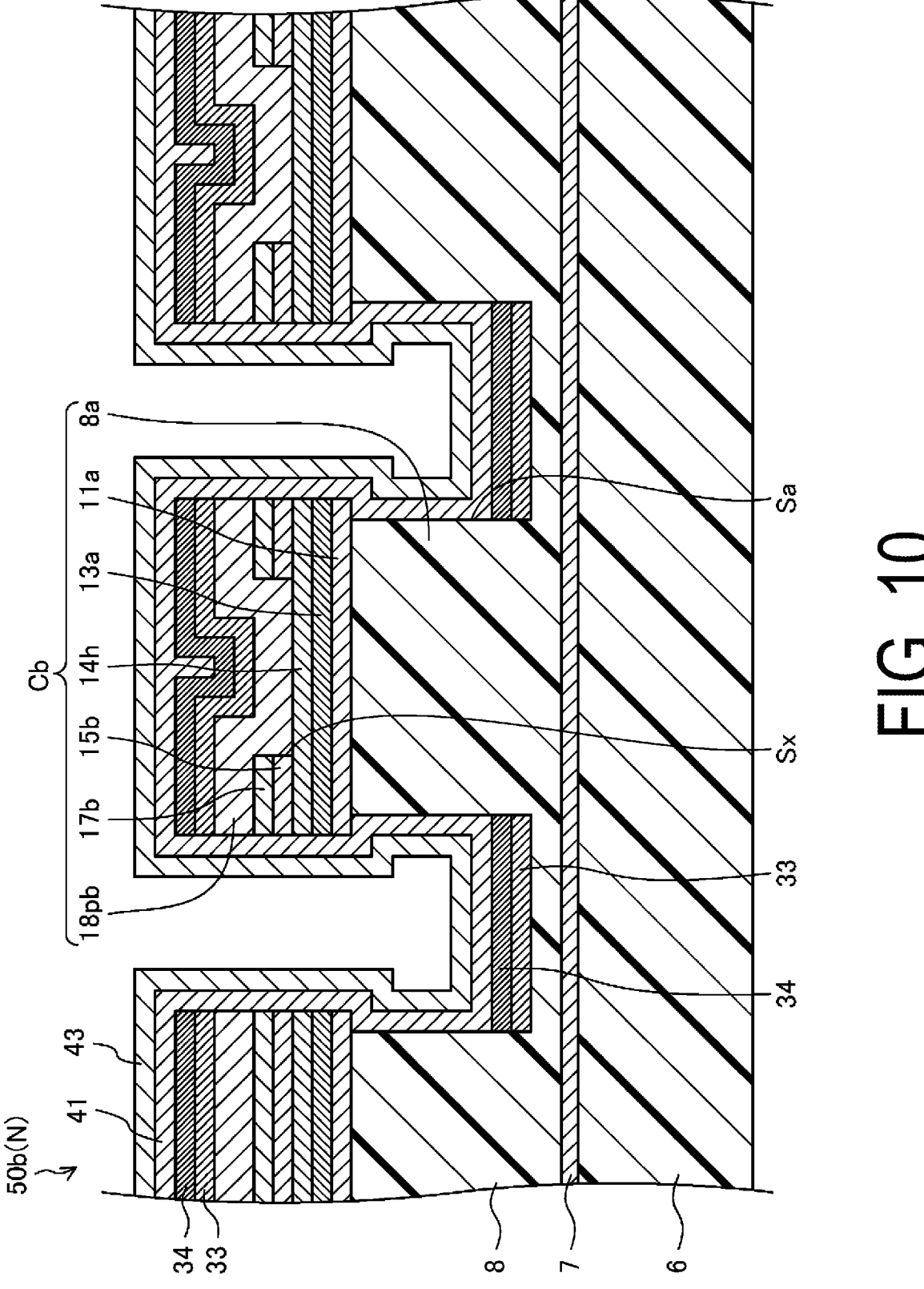
FIG. 10 is an enlarged cross-sectional view of an inversely tapered protruding portion in a non-display region of an organic EL display device according to a second embodiment of the disclosure.
Figure 11:
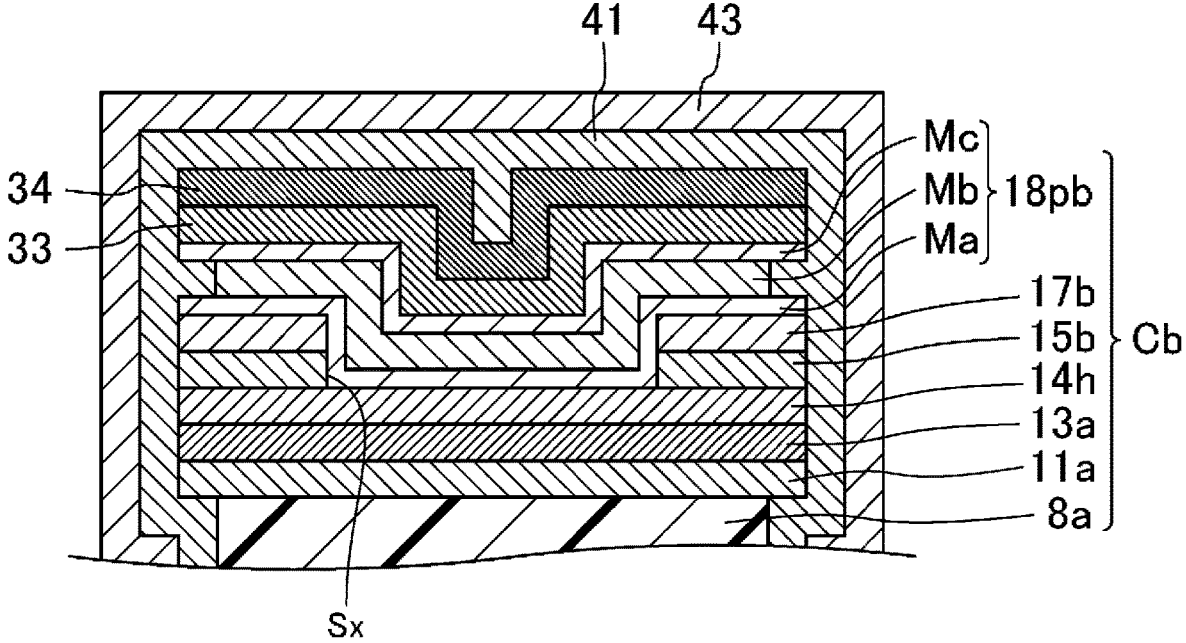
FIG. 11 is an enlarged cross-sectional view of an upper portion of the inversely tapered protruding portion in the non-display region of the organic EL display device according to the second embodiment of the disclosure.

FIG. 10 and FIG. 11 illustrate a second embodiment of the display device according to the disclosure. Here, FIG. 10 is an enlarged cross-sectional view of an inversely tapered protruding portion Cb in the non-display region N of an organic EL display device 50b of the present embodiment. In addition, FIG. 11 is an enlarged cross-sectional view of an upper portion of the inversely tapered protruding portion Cb in the non-display region N of the organic EL display device 50b. Note that in the following embodiment, the same reference signs will be given to the same portions as those illustrated in FIG. 1 to FIG. 9, so that detailed descriptions thereof will be omitted.

In the first embodiment described above, the organic EL display device 50a has been exemplified in which the metal layer 18pa having a flat shape is provided. However, in the present embodiment, the organic EL display device 50*b* including a metal layer 18*pb* having a cross section having a U-shape is exemplified.

Same as the organic EL display device 50*a* of the first embodiment described above, the organic EL display device 50*b* is provided with the display region D and the frame region F provided around the display region D.

Additionally, as with the organic EL display device 50*a* of the first embodiment described above, the organic EL display device 50*b* includes the resin substrate layer 10, the TFT layer 30 provided on the resin substrate layer 10, the organic EL element layer 40 provided on the TFT layer 30, and the encapsulation film 45 provided so as to cover the organic EL element layer 40. Note that in the organic EL display device 50*b*, as with the organic EL display device 50*a* of the first embodiment described above, the electronic component 60 is installed in the through-hole H formed in the non-display region N inside the display region D.

Additionally, as illustrated in FIG. 10 and FIG. 11, the organic EL display device 50*b* includes a plurality of inversely tapered protruding portions Cb each of which is provided concentrically and annularly so as to surround the through-hole H in the non-display region N.

As illustrated in FIG. 10 and FIG. 11, each of the inversely tapered protruding portions Cb includes the resin portion 8*a* constituted by the second resin substrate layer 8 of the resin substrate layer 10, a first inorganic insulating layer 11*a*, a second inorganic insulating layer 13*a*, a gate metal layer 14*h*, a third inorganic insulating layer 15*b*, and a fourth inorganic insulating layer 17*b* that are sequentially provided on the resin portion 8*a*, and the metal layer 18*pb* provided on the fourth inorganic insulating layer 17*b*. Note that in the present embodiment, the configuration in which the metal layer 18*pb* is provided on the fourth inorganic insulating layer 17*b* in each of the inversely tapered protruding portions Cb is exemplified, but the metal layer 18*pb* may be provided in at least one of the plurality of inversely tapered protruding portions Cb. Additionally, as illustrated in FIG. 10 and FIG. 11, the organic EL layer 33 and the second electrode 34 are separated from those in the display region D and sequentially layered on each of the inversely tapered protruding portions Cb.

The first inorganic insulating layer 11*a*, the second inorganic insulating layer 13*a*, the third inorganic insulating layer 15*b*, and the fourth inorganic insulating layer 17*b* are formed of identical materials in identical layers to those of the base coat film 11, the gate insulating film 13, the first interlayer insulating film 15, and the second interlayer insulating film 17, respectively. In addition, the gate metal layer 14*h* is formed of an identical material in an identical layer to those of the first wiring layer including the gate line 14*g* and the like. Here, as illustrated in FIG. 10 and FIG. 11, in each of the inversely tapered protruding portions Cb, the first inorganic insulating layer 11*a*, the second inorganic insulating layer 13*a*, the gate metal layer 14*h*, the third inorganic insulating layer 15*b*, and the fourth inorganic insulating layer 17*b* are provided so as to protrude from the resin portion 8*a* to the through-hole H side and the display region D side in an eaves shape. Note that in the present embodiment, the configuration is exemplified in which the first inorganic insulating layer 11*a*, the second inorganic insulating layer 13*a*, the gate metal layer 14*h*, the third inorganic insulating layer 15*b*, and the fourth inorganic insulating layer 17*b* protrude from the resin portion 8*a* in an eaves shape to both the through-hole H side and the display region D side. However, the first inorganic insulating layer 11*a*, the second inorganic insulating layer 13*a*, the gate metal layer 14*h*, the third inorganic insulating layer 15*b*, and the fourth inorganic insulating layer 17*b* may protrude from the resin portion 8*a* in an eaves shape to either the through-hole H side or the display region D side. According to these configurations, since each of the inversely tapered protruding portions Cb has an inversely tapered structure in the non-display region N, the common organic EL layer 33 and second electrode 34 are formed so as to be separated into the display region D side and the through-hole H side by a step by the inversely tapered structure having the eaves shape. In addition, as illustrated in FIG. 10 and FIG. 11, an upper slit Sx penetrating through the third inorganic insulating layer 15*b* and the fourth inorganic insulating layer 17*b* is formed at an intermediate portion in a width direction of the third inorganic insulating layer 15*b* and the fourth inorganic insulating layer 17*b*.

The metal layer 18*pb* is formed of an identical material in an identical layer to those of the third wiring layer including the source line 18*f* and the like, and as illustrated in FIG. 10 and FIG. 11, is provided so as to cover both side surfaces and a bottom surface of the upper slit Sx, and has a cross section having a U-shape. Further, as illustrated in FIG. 11, the metal layer 18*pb* includes the first metal layer Ma, the second metal layer Mb, and the third metal layer Mc that are sequentially layered on the fourth inorganic insulating layer 17*b*. Here, in the metal layer 18*pb*, as illustrated in FIG. 11, the inner peripheral edge portion and the outer peripheral edge portion of the first metal layer Ma and the inner peripheral edge portion and the outer peripheral edge portion of the third metal layer Mc protrude in eaves shapes with respect to the inner peripheral edge portion and the outer peripheral edge portion of the second metal layer Mb. Note that although the metal layer 18*pb* formed of the identical material in the identical layer to those of the third wiring layer is exemplified in the present embodiment, the metal layer may be formed of the identical material in the identical layer to those of the second wiring layer or the fourth wiring layer.

Further, as with the organic EL display device 50*a* of the first embodiment described above, the organic EL display device 50*b* includes the outer substrate slit Sb provided concentrically and annularly at a surface of the second resin substrate layer 8 on the TFT layer 30 side so as to surround the plurality of substrate slits Sa in the non-display region N.

Further, as with the organic EL display device 50*a* of the first embodiment described above, the organic EL display device 50*b* is provided with the inner dam wall We provided annularly between the plurality of substrate slits Sa and the outer substrate slit Sb in the non-display region N.

Further, as with the organic EL display device 50*a* of the first embodiment described above, the organic EL display device 50*b* includes, in the frame region F, the first outer dam wall Wa provided so as to surround the display region D, and the second outer dam wall Wb provided around the first outer dam wall Wa.

Further, as with the organic EL display device 50*a* of the first embodiment described above, the organic EL display device 50*b* includes, in the frame region F, the first frame wiring line 18*h* provided in a frame-like shape inside the trench G and the second frame wiring line 18*i* provided outside the trench G.

Further, as with the organic EL display device 50*a* of the first embodiment described above, the organic EL display device 50*b* includes a plurality of peripheral photo spacers 32*b* provided so as to protrude upward at both edge portions of the trench G in the frame region F.

As with the organic EL display device 50a of the first embodiment described above, the organic EL display device 50b described above has flexibility and is configured to display an image by causing the organic light-emitting layer 3 of the organic EL layer 33 to emit light as appropriate via the first TFT 9a, the second TFT 9b, and the third TFT 9c in each subpixel P.

The organic EL display device 50b of the present embodiment can be manufactured by forming the gate metal layer 14h in the non-display region N in forming the first wiring layer including a gate line 14g and the like, and partially removing the layered film of the first interlayer insulating film 15 and the second interlayer insulating film 17 in the non-display region N before forming the third wiring layer including the source line 18f and the like to form portions to be the third inorganic insulating layer 15b and the fourth inorganic insulating layer 17b in the TFT forming step of the method for manufacturing the organic EL display device 50a of the first embodiment.

As described above, according to the organic EL display device 50b of the present embodiment, in each of the inversely tapered protruding portions Cb, the metal layer 18pb is provided on the layered body of the first inorganic insulating layer 11a, the second inorganic insulating layer 13a, the third inorganic insulating layer 15b, and the fourth inorganic insulating layer 17b. Here, since the metal layer 18pb has ductility, the metal layer 18pb can absorb more impact from the outside, as compared with the inorganic insulating films constituting the first inorganic encapsulation film 41 and the second inorganic encapsulation film 43. Accordingly, since the occurrence and progress of cracks in the first inorganic encapsulation film 41 and the second inorganic encapsulation film 43 can be suppressed, the occurrence of cracks in the first inorganic encapsulation film 41 and the second inorganic encapsulation film 43 and the progress of the cracks to the display region D can be suppressed around the through-hole H. Then, since the progress of the cracks to the display region D in the first inorganic encapsulation film 41 and the second inorganic encapsulation film 43 is suppressed, inflow of moisture or the like to the organic EL layer 33 can be suppressed, which can suppress a display defect due to deterioration of the organic EL layer 33.

In addition, according to the organic EL display device 50b of the present embodiment, in the metal layer 18pb, the peripheral edge portions of the first metal layer Ma and the third metal layer Mc protrude in eave shapes with respect to the peripheral edge portion of the second metal layer Mb, which can suppress film peeling of the encapsulation film 45 due to an anchoring effect of the inversely tapered structure of the first metal layer Ma, the second metal layer Mb, and the third metal layer Mc.

In addition, according to the organic EL display device 50b of the present embodiment, since the metal layer 18pb has a cross section having a U-shape in the upper slit Sx, stress such as bending stress is hardly transmitted in the non-display region N, which suppresses the progress of cracks caused by the stress to the display region D.

Third Embodiment

Figure 12:
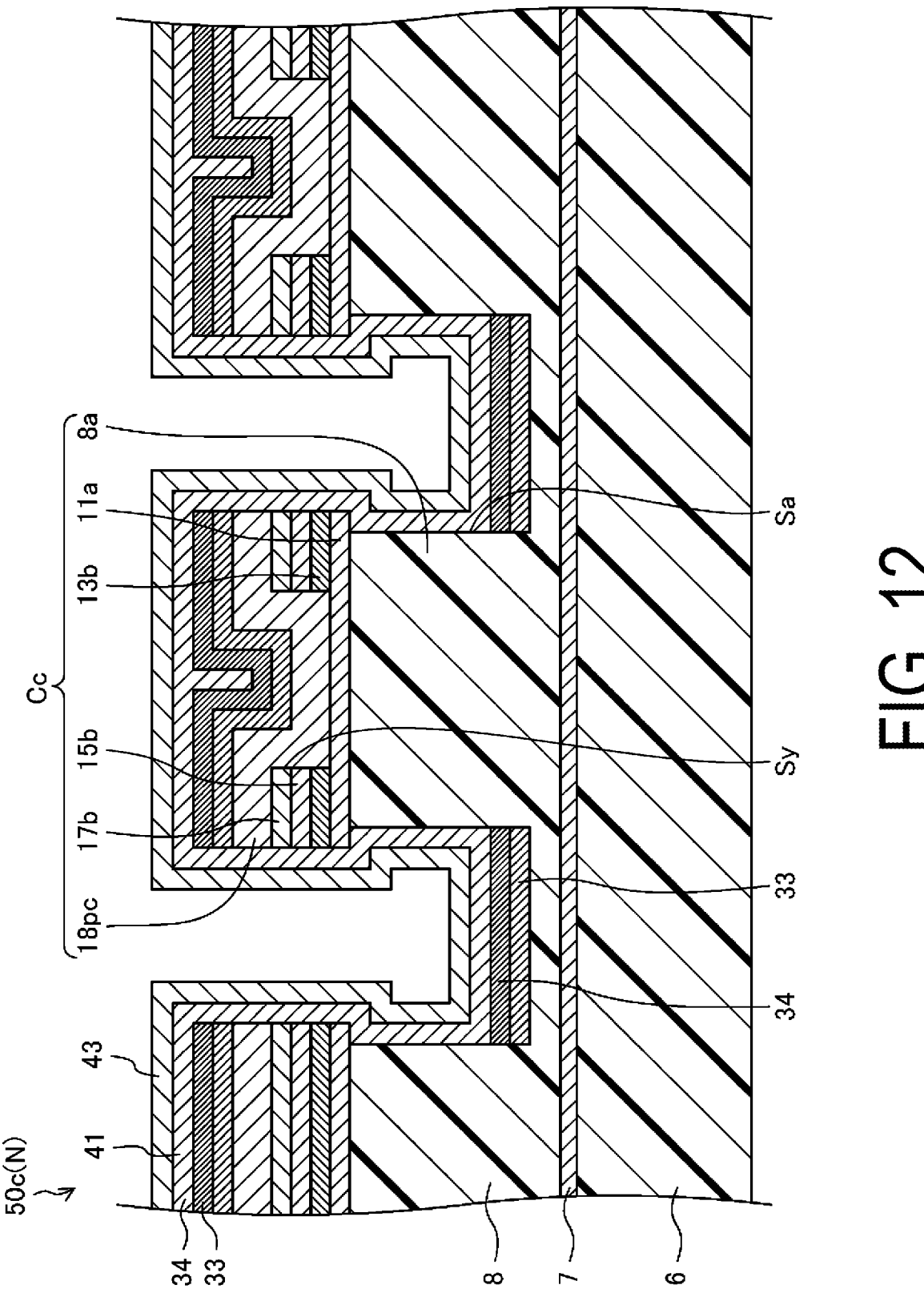
FIG. 12 is an enlarged cross-sectional view of an inversely tapered protruding portion in a non-display region of an organic EL display device according to a third embodiment of the disclosure.

FIG. 12 illustrates a third embodiment of the display device according to the disclosure. Here, FIG. 12 is an enlarged cross-sectional view of an inversely tapered protruding portion Cc in the non-display region N of an organic EL display device 50c of the present embodiment.

In the second embodiment, the organic EL display device 50b in which the upper slit Sx is provided in the third inorganic insulating layer 15b and the fourth inorganic insulating layer 17b has been exemplified, but in the present embodiment, the organic EL display device 50c in which an upper slit Sy is provided in the second inorganic insulating layer 13b, the third inorganic insulating layer 15b, and the fourth inorganic insulating layer 17b is exemplified.

The organic EL display device 50c, as with the organic EL display device 50a of the first embodiment described above, includes the display region D and the frame region F provided at the periphery of the display region D.

Additionally, as with the organic EL display device 50a of the first embodiment described above, the organic EL display device 50c includes the resin substrate layer 10, the TFT layer 30 provided on the resin substrate layer 10, the organic EL element layer 40 provided on the TFT layer 30, and the encapsulation film 45 provided so as to cover the organic EL element layer 40. Note that in the organic EL display device 50c, as with the organic EL display device 50a of the first embodiment described above, the electronic component 60 is installed in the through-hole H formed in the non-display region N inside the display region D.

Additionally, as illustrated in FIG. 12, the organic EL display device 50c includes a plurality of inversely tapered protruding portions Cc each of which is provided concentrically and annularly so as to surround the through-hole H inside the non-display region N.

As illustrated in FIG. 12, each of the inversely tapered protruding portions Cc includes the resin portion 8a constituted by the second resin substrate layer 8 of the resin substrate layer 10, the first inorganic insulating layer 11a, the second inorganic insulating layer 13b, the third inorganic insulating layer 15b, and the fourth inorganic insulating layer 17b that are sequentially provided on the resin portion 8a, and a metal layer 18pc provided on the fourth inorganic insulating layer 17b. Note that in the present embodiment, the configuration in which the metal layer 18pc is provided on the fourth inorganic insulating layer 17b in each of the inversely tapered protruding portions Cc has been exemplified, but the metal layer 18pc may be provided in at least one of the plurality of inversely tapered protruding portions Cc. Moreover, as illustrated in FIG. 12, the organic EL layer 33 and the second electrode 34 are separated from those in the display region D and sequentially layered on each of the inversely tapered protruding portions Cc.

The first inorganic insulating layer 11a, the second inorganic insulating layer 13b, the third inorganic insulating layer 15b, and the fourth inorganic insulating layer 17b are formed of the identical materials in the identical layers to those of the base coat film 11, the gate insulating film 13, the first interlayer insulating film 15, and the second interlayer insulating film 17, respectively. Here, as illustrated in FIG. 12, the first inorganic insulating layer 11a, the second inorganic insulating layer 13b, the third inorganic insulating layer 15b, and the fourth inorganic insulating layer 17b in each of the inversely tapered protruding portions Cc are provided so as to protrude in an eaves shape from the resin portion 8a to the through-hole H side and the display region D side. Note that in the present embodiment, the configuration is exemplified in which the first inorganic insulating layer 11a, the second inorganic insulating layer 13b, the third inorganic insulating layer 15b, and the fourth inorganic insulating layer 17b protrude from the resin portion 8a in an eaves shape to both the through-hole H side and the display region D side. However, the first inorganic insulating layer 11a, the second inorganic insulating layer 13b, the third inorganic insulating layer 15b, and the fourth inorganic insulating layer 17b may protrude from the resin portion 8a in an eaves shape to either the through-hole H side or the display region D side. According to this configuration, since each of the inversely tapered protruding portions Cc has an inversely tapered structure in the non-display region N, the common organic EL layer 33 and second electrode 34 are formed to be separated into the through-hole H side and the display region D side by a step by the inversely tapered structure having an eaves shape. In addition, as illustrated in FIG. 12, the upper slit Sy penetrating through the second inorganic insulating layer 13b, the third inorganic insulating layer 15b, and the fourth inorganic insulating layer 17b is formed at an intermediate portion in a width direction of the second inorganic insulating layer 13b, the third inorganic insulating layer 15b, and the fourth inorganic insulating layer 17b.

The metal layer 18pc is formed of an identical material in an identical layer to those of the third wiring layer including the source line 18f and the like, and as illustrated in FIG. 12, is provided so as to cover both side surfaces and a bottom surface of the upper slit Sy, and has a cross section having a U-shape. Further, the metal layer 18pc includes the first metal layer Ma, the second metal layer Mb, and the third metal layer Mc that are sequentially layered on the fourth inorganic insulating layer 17b, as with the metal layer 18pa included in the organic EL display device 50a of the first embodiment and the metal layer 18pb included in the organic EL display device 50b of the second embodiment. Note that although the metal layer 18pc formed of the identical material in the identical layer to those of the third wiring layer is exemplified in the present embodiment, the metal layer may be formed of the identical material in the identical layer to those of the fourth wiring layer.

Additionally, as with the organic EL display device 50a of the first embodiment described above, the organic EL display device 50c includes the outer substrate slit Sb provided concentrically and annularly so as to surround a plurality of substrate slits Sa on a surface of the second resin substrate layer 8 on the TFT layer 30 side in the non-display region N.

Additionally, the organic EL display device 50c, as with the organic EL display device 50a of the first embodiment described above, includes the inner dam wall We annularly provided between the plurality of substrate slits Sa and the outer substrate slit Sb in the non-display region N.

Additionally, as with the organic EL display device 50a of the first embodiment described above, the organic EL display device 50c includes, in the frame region F, the first outer dam wall Wa provided so as to surround the display region D, and the second outer dam wall Wb provided around the first outer dam wall Wa.

Additionally, as with the organic EL display device 50a of the first embodiment described above, the organic EL display device 50c includes, in the frame region F, the first frame wiring line 18h provided in a frame-like shape inside the trench G and the second frame wiring line 18i provided outside the trench G.

Further, as with the organic EL display device 50a of the first embodiment described above, the organic EL display device 50c includes a plurality of peripheral photo spacers 32b provided so as to protrude upward at both edge portions of the trench G in the frame region F.

As with the organic EL display device 50a of the first embodiment described above, the organic EL display device 50c described above has flexibility and is configured to display an image by causing the organic light-emitting layer 3 of the organic EL layer 33 to emit light as appropriate via the first TFT 9a, the second TFT 9b, and the third TFT 9c in each subpixel P.

The organic EL display device 50c of the present embodiment can be manufactured by partially removing the layered film of the gate insulating film 13, the first interlayer insulating film 15, and the second interlayer insulating film 17 in the non-display region N before forming the third wiring layer including the source line 18f and the like in the TFT layer forming step of the method for manufacturing the organic EL display device 50a of the first embodiment to form portions to be the second inorganic insulating layer 13b, the third inorganic insulating layer 15b, and the fourth inorganic insulating layer 17b.

As described above, according to the organic EL display device 50c of the present embodiment, in each of the inversely tapered protruding portions Cc, the metal layer 18pc is provided on the layered body of the first inorganic insulating layer 11a, the second inorganic insulating layer 13b, the third inorganic insulating layer 15b, and the fourth inorganic insulating layer 17b. Here, since the metal layer 18pc has ductility, the metal layer 18pc can absorb more impact from the outside as compared with the inorganic insulating films constituting the first inorganic encapsulation film 41 and the second inorganic encapsulation film 43. Accordingly, since the occurrence and progress of cracks in the first inorganic encapsulation film 41 and the second inorganic encapsulation film 43 can be suppressed, the occurrence of cracks in the first inorganic encapsulation film 41 and the second inorganic encapsulation film 43 and the progress of the cracks to the display region D can be suppressed around the through-hole H. Then, since the progress of the cracks to the display region D in the first inorganic encapsulation film 41 and the second inorganic encapsulation film 43 is suppressed, inflow of moisture or the like to the organic EL layer 33 can be suppressed, which can suppress a display defect due to deterioration of the organic EL layer 33.

In addition, according to the organic EL display device 50c of the present embodiment, in the metal layer 18pc, the peripheral edge portions of the first metal layer Ma and the third metal layer Mc protrude in eave shapes with respect to the peripheral edge portion of the second metal layer Mb, which can suppress film peeling of the encapsulation film 45 by an anchoring effect of the inversely tapered structure constituted by the first metal layer Ma, the second metal layer Mb, and the third metal layer Mc.

In addition, according to the organic EL display device 50c of the present embodiment, since the metal layer 18pc has a cross section having a U-shape in the upper slit Sy, stress such as bending stress is less likely to be transmitted in the non-display region N, and thus, the progress of the cracks caused by the stress to the display region D can be suppressed. Note that in the organic EL display device 50c, since the upper slit Sy is also formed in the second inorganic insulating layer 13b, the upper slit Sx has a cross section having a U-shape deeper than that of the organic EL display device 50b of the second embodiment in which the upper slit Sx is formed only in the third inorganic insulating layer 15b and the fourth inorganic insulating layer 17b, and thus, the advancing of the cracks caused by the stress to the display region D can be further suppressed.

Fourth Embodiment

Figure 13:
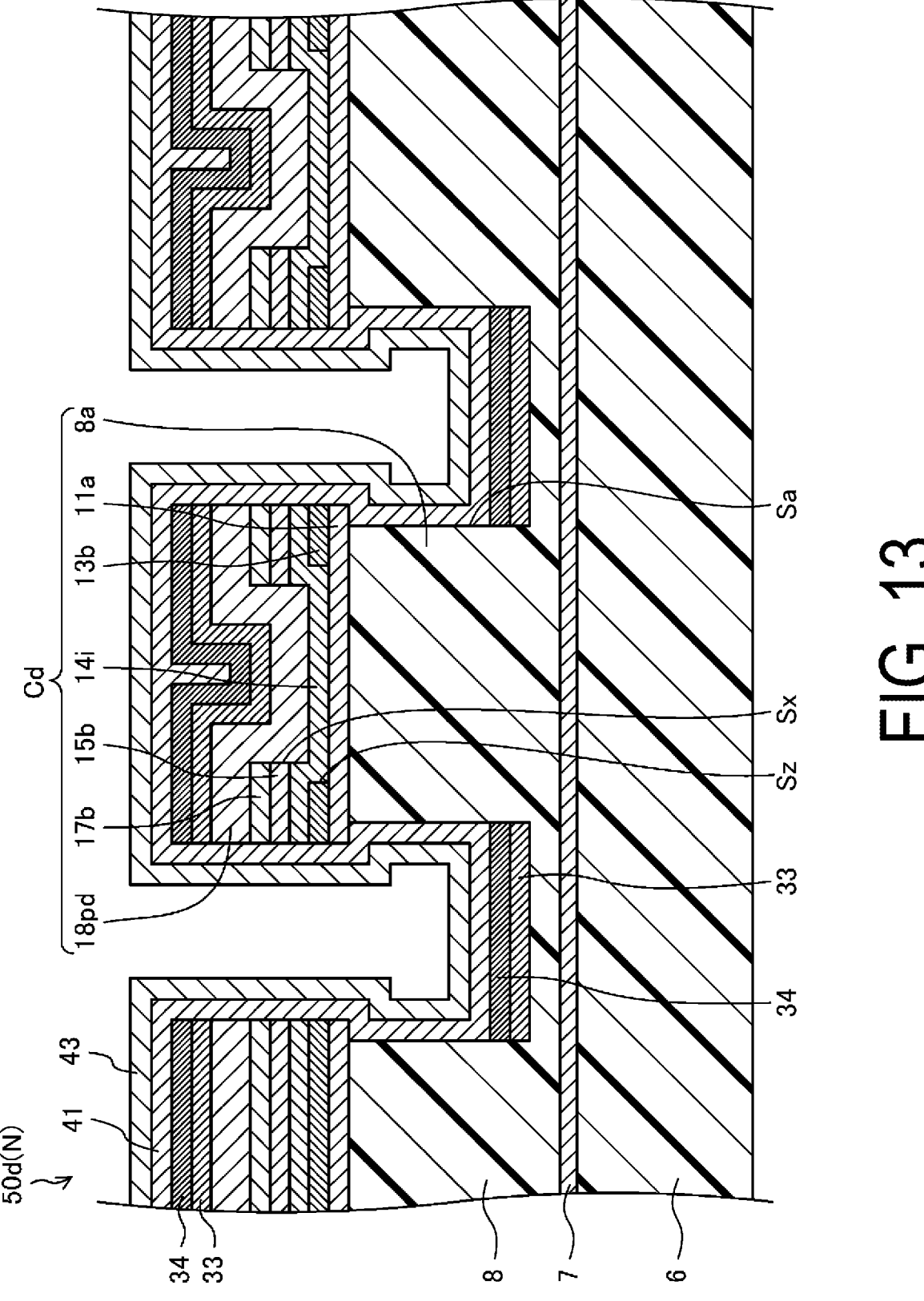
FIG. 13 is an enlarged cross-sectional view of an inversely tapered protruding portion in a non-display region of an organic EL display device according to a fourth embodiment of the disclosure.

FIG. 13 illustrates a fourth embodiment of the display device according to the disclosure. Here, FIG. 13 is an enlarged cross-sectional view of an inversely tapered protruding portion Cd in the non-display region N of an organic EL display device 50*d* of the present embodiment.

In the second and third embodiments described above, the organic EL display devices 50*b* and 50*c* in which the metal layers 18*pb* and 18*pc* each of which has the cross-sectional structure having the U-shape are singly respectively provided have been exemplified, but in the present embodiment, the organic EL display device 50*d* in which a metal layer 18*pd* and the gate metal layer 14*i* each of which has a cross-sectional structure having a U-shape are doubly provided is exemplified.

Same as the organic EL display device 50*a* of the first embodiment described above, the organic EL display device 50*d* is provided with the display region D and the frame region F provided around the display region D.

Additionally, as with the organic EL display device 50*a* of the first embodiment described above, the organic EL display device 50*d* includes the resin substrate layer 10, the TFT layer 30 provided on the resin substrate layer 10, the organic EL element layer 40 provided on the TFT layer 30, and the encapsulation film 45 provided so as to cover the organic EL element layer 40. Note that in the organic EL display device 50*d*, as with the organic EL display device 50*a* of the first embodiment described above, the electronic component 60 is installed in the through-hole H formed in the non-display region N inside the display region D.

Additionally, as illustrated in FIG. 13, the organic EL display device 50*d* includes a plurality of inversely tapered protruding portions Cd each of which is provided concentrically and annularly so as to surround the through-hole H in the non-display region N.

As illustrated in FIG. 13, each of the inversely tapered protruding portions Cd includes the resin portion 8*a* constituted by the second resin substrate layer 8 of the resin substrate layer 10, the first inorganic insulating layer 11*a*, the second inorganic insulating layer 13*b*, the gate metal layer 14*i*, the third inorganic insulating layer 15*b*, and the fourth inorganic insulating layer 17*b* that are sequentially provided on the resin portion 8*a*, and the metal layer 18*pd* provided on the fourth inorganic insulating layer 17*b*. Note that in the present embodiment, in each of the inversely tapered protruding portions Cd, the configuration is exemplified in which the metal layer 18*pd* is provided on the fourth inorganic insulating layer 17*b*, and the gate metal layer 14*i* is provided between the second inorganic insulating layer 13*b* and the third inorganic insulating layer 15*b*. However, the metal layer 18*pd* and the gate metal layer 14*i* may be provided in at least one of the plurality of inversely tapered protruding portions Cd. Additionally, as illustrated in FIG. 13, the organic EL layer 33 and the second electrode 34 are separated from those in the display region D and sequentially layered on each of the inversely tapered protruding portions Cd.

The first inorganic insulating layer 11*a*, the second inorganic insulating layer 13*b*, the third inorganic insulating layer 15*b*, and the fourth inorganic insulating layer 17*b* are formed of the identical materials in the identical layers to those of the base coat film 11, the gate insulating film 13, the first interlayer insulating film 15, and the second interlayer insulating film 17, respectively. Here, as illustrated in FIG. 13, the first inorganic insulating layer 11*a*, the second inorganic insulating layer 13*b*, the gate metal layer 14*i*, the third inorganic insulating layer 15*b*, and the fourth inorganic insulating layer 17*b* in each of the inversely tapered protruding portions Cd are provided so as to protrude from the resin portion 8*a* to the through-hole H side and the display region D side in an eaves shape. Note that in the present embodiment, the configuration is exemplified in which the first inorganic insulating layer 11*a*, the second inorganic insulating layer 13*b*, the gate metal layer 14*i*, the third inorganic insulating layer 15*b*, and the fourth inorganic insulating layer 17*b* protrude from the resin portion 8*a* in the eaves shape to both the through-hole H side and the display region D side. However, the first inorganic insulating layer 11*a*, the second inorganic insulating layer 13*b*, the gate metal layer 14*i*, the third inorganic insulating layer 15*b*, and the fourth inorganic insulating layer 17*b* may protrude from the resin portion 8*a* in an eaves shape to either the through-hole H side or the display region D side. According to these configurations, since each of the inversely tapered protruding portions Cd has an inversely tapered structure in the non-display region N, the common organic EL layer 33 and second electrode 34 are formed so as to be separated into the through-hole H side and the display region D side by a step by the inversely tapered structure having the eaves shape. In addition, as illustrated in FIG. 13, a lower slit Sz penetrating through the second inorganic insulating layer 13*b* is formed at an intermediate portion in a width direction of the second inorganic insulating layer 13*b*. In addition, as illustrated in FIG. 13, the upper slit Sx penetrating through the third inorganic insulating layer 15*b* and the fourth inorganic insulating layer 17*b* is formed at an intermediate portion in a width direction of the third inorganic insulating layer 15*b* and the fourth inorganic insulating layer 17*b*.

Further, the gate metal layer 14*i* is formed of the identical material in the identical layer to those of the first wiring layer including the gate line 14*g* and the like, and as illustrated in FIG. 13, is provided so as to cover both side surfaces and a bottom surface of the lower slit Sz, and has a cross section having a U-shape.

The metal layer 18*pd* is formed of the identical material in the identical layer to those of the third wiring layer including the source line 18*f* and the like, and as illustrated in FIG. 13, is provided so as to cover both the side surfaces and the bottom surface of the upper slit Sx, and has a cross section having a U-shape. Moreover, the metal layer 18*pd* includes the first metal layer Ma, the second metal layer Mb, and the third metal layer Mc that are sequentially layered on the fourth inorganic insulating layer 17*b*, as with the metal layer 18*pa* included in the organic EL display device 50*a* of the first embodiment and the metal layer 18*pb* included in the organic EL display device 50*b* of the second embodiment. Note that although the metal layer 18*pd* formed of the identical material in the identical layer to those of the third wiring layer is exemplified in the present embodiment, the metal layer may be formed of the identical material in the identical layer to those of the fourth wiring layer.

Additionally, as with the organic EL display device 50*a* of the first embodiment described above, the organic EL display device 50*d* includes the outer substrate slit Sb provided concentrically and annularly so as to surround the plurality of substrate slits Sa on the surface of the second resin substrate layer 8 on the TFT layer 30 side in the non-display region N.

Further, as with the organic EL display device 50*a* of the first embodiment, the organic EL display device 50*d* includes the inner dam wall We provided annularly between the plurality of substrate slits Sa and the outer substrate slit Sb in the non-display region N.

Further, as with the organic EL display device 50*a* of the first embodiment described above, the organic EL display device 50*d* includes, in the frame region F, the first outer dam wall Wa provided so as to surround the display region D, and the second outer dam wall Wb provided around the first outer dam wall Wa.

Further, as with the organic EL display device 50*a* of the first embodiment described above, the organic EL display device 50*d* includes, in the frame region F, the first frame wiring line 18*h* provided in a frame-like shape inside the trench G and the second frame wiring line 18*i* provided outside the trench G.

Further, as with the organic EL display device 50*a* of the first embodiment described above, the organic EL display device 50*d* includes a plurality of peripheral photo spacers 32*b* provided so as to protrude upward at both edge portions of the trench G in the frame region F.

As with the organic EL display device 50*a* of the first embodiment described above, the organic EL display device 50*d* described above has flexibility and is configured to display an image by causing the organic light-emitting layer 3 of the organic EL layer 33 to emit light as appropriate via the first TFT 9*a*, the second TFT 9*b*, and the third TFT 9*c* in each subpixel P.

The organic EL display device 50*d* of the present embodiment can be manufactured by partially removing the gate insulating film 13 in the non-display region N to form a portion serving as the second inorganic insulating layer 13*b* after forming the gate insulating film 13, forming the gate metal layer 14*i* in the non-display region N in forming the first wiring layer including the gate line 14*g* and the like, and partially removing the layered film of the first interlayer insulating film 15 and the second interlayer insulating film 17 in the non-display region N to form a portion serving as the third inorganic insulating layer 15*b* and the fourth inorganic insulating layer 17*b* before forming the third wiring layer including the source line 18*f* and the like in the TFT layer forming step of the method for manufacturing the organic EL display device 50*a* of the first embodiment.

As described above, according to the organic EL display device 50*d* of the present embodiment, in each of the inversely tapered protruding portions Cd, the metal layer 18*pd* is provided on the layered body of the first inorganic insulating layer 11*a*, the second inorganic insulating layer 13*b*, the third inorganic insulating layer 15*b*, and the fourth inorganic insulating layer 17*b*. Here, since the metal layer 18*pd* has ductility, the metal layer 18*pd* can absorb more impact from the outside as compared with the inorganic insulating films constituting the first inorganic encapsulation film 41 and the second inorganic encapsulation film 43. Accordingly, since the occurrence and progress of cracks in the first inorganic encapsulation film 41 and the second inorganic encapsulation film 43 can be suppressed, the occurrence of cracks in the first inorganic encapsulation film 41 and the second inorganic encapsulation film 43 and the progress of the cracks to the display region D can be suppressed around the through-hole H. Then, since the progress of the cracks to the display region D in the first inorganic encapsulation film 41 and the second inorganic encapsulation film 43 is suppressed, inflow of moisture or the like to the organic EL layer 33 can be suppressed, which can suppress a display defect due to deterioration of the organic EL layer 33.

In addition, according to the organic EL display device 50*d* of the present embodiment, in the metal layer 18*pd*, the peripheral edge portions of the first metal layer Ma and the third metal layer Mc protrude in eaves shapes with respect to the peripheral edge portion of the second metal layer Mb, which can suppress film peeling of the encapsulation film 45 caused by an anchoring effect of the inversely tapered structure of the first metal layer Ma, the second metal layer Mb, and the third metal layer Mc.

Further, according to the organic EL display device 50*d* of the present embodiment, since not only does the metal layer 18*pd* have the cross section having the U-shape in the upper slit Sx but also the gate metal layer 14*i* has the cross section having the U-shape in the lower slit Sz, stress such as bending stress is more difficult to be transmitted in the non-display region N, and the progress of cracks to the display region D due to the stress can be further suppressed.

Other Embodiments

In each of the embodiments described above, the organic EL layer having a five-layer structure including the hole injection layer, the hole transport layer, the organic light-emitting layer, the electron transport layer, and the electron injection layer has been exemplified, but the organic EL layer may have a three-layer structure including a hole injection-cum-transport layer, an organic light-emitting layer, and an electron transport-cum-injection layer, for example.

Further, in each of the embodiments described above, the organic EL display device including the first electrode as an anode and the second electrode as a cathode has been exemplified. The disclosure is also applicable to an organic EL display device in which the layered structure of the organic EL layers is reversed with the first electrode being a cathode and the second electrode being an anode.

In each of the embodiments described above, the organic EL display device in which the electrode of the TFT connected to the first electrode serves as the drain electrode has been exemplified. However, the disclosure is also applicable to an organic EL display device in which the electrode of the TFT connected to the first electrode is referred to as the source electrode.

Further, in each of the embodiments described above, the organic EL display device has been exemplified as a display device. The disclosure can also be applied to a display device including a plurality of light-emitting elements to be driven by a current, for example, to a display device including a Quantum dot Light-Emitting Diode (QLED), which is a light-emitting element using a quantum dot-containing layer.

INDUSTRIAL APPLICABILITY

As described above, the disclosure is useful for a flexible display device.

The invention claimed is:

1. A display device comprising:
   a resin substrate layer;
   a thin film transistor layer provided on the resin substrate layer and sequentially layered with an inorganic insulating film and a metal wiring layer;
   a light-emitting element layer provided on the thin film transistor layer and sequentially layered with a plurality of first electrodes, a common light-emitting function layer, and a common second electrode corresponding to a plurality of subpixels constituting a display region; and
   a first inorganic encapsulation film covering the light-emitting element layer,
   wherein a non-display region having an island shape is provided inside the display region, a through-hole penetrating through the resin substrate layer in a thickness direction of the resin substrate layer is provided in the non-display region, a plurality of inversely tapered protruding portions surrounding the through-hole are provided in the non-display region, each of the plurality of inversely tapered protruding portions includes a resin portion formed of the resin substrate layer and an inorganic insulating layer provided on the resin portion and formed of a material identical to a material of the inorganic insulating film in a layer identical to a layer of the inorganic insulating film, the resin portion included in each of the plurality of inversely tapered protruding portions is separated by corresponding slits of a plurality of substrate slits, the plurality of substrate slits surrounding the through-hole on a surface on a side of the thin film transistor layer of the resin substrate layer, the inorganic insulating layer protrudes in an eaves shape toward at least one of a side of the through-hole and a side of the display region from the resin portion in each of the plurality of inversely tapered protruding portions, the first inorganic encapsulation film covers the plurality of inversely tapered protruding portions and the plurality of substrate slits in a region provided with the plurality of inversely tapered protruding portions and the plurality of substrate slits, a metal layer formed of a material identical to a material of the metal wiring layer in a layer identical to a layer of the metal wiring layer is provided on the inorganic insulating layer in at least one of the plurality of inversely tapered protruding portions, and an upper slit penetrating through the inorganic insulating layer is formed at an intermediate portion in a width direction of the inorganic insulating layer, and the metal layer covers both side surfaces and a bottom surface of the upper slit.

2. The display device according to claim 1, wherein the metal layer has a cross section having a U-shape in the upper slit.

3. The display device according to claim 2, wherein a base coat film, a gate insulating film, a first interlayer insulating film, and a second interlayer insulating film are sequentially provided as the inorganic insulating film on the resin substrate layer, the resin portion is sequentially provided with, as the inorganic insulating layer, a first inorganic insulating layer formed of a material identical to a material of the base coat film in a layer identical to a layer of the base coat film, a second inorganic insulating layer formed of a material identical to a material of the gate insulating film in a layer identical to a material of the gate insulating film, a third inorganic insulating layer formed of a material identical to a material of the first interlayer insulating film in a layer identical to a layer of the first interlayer insulating film, and a fourth inorganic insulating layer formed of a material identical to a material of the second interlayer insulating film in a layer identical to a layer of the second interlayer insulating film, and the upper slit is formed in the third inorganic insulating layer and the fourth inorganic insulating layer.

4. The display device according to claim 3, wherein the thin film transistor layer includes a gate wiring layer provided between the gate insulating film and the first interlayer insulating film, and each of the plurality of inversely tapered protruding portions includes a gate metal layer provided between the second inorganic insulating layer and the third inorganic insulating layer and formed of a material identical to a material of the gate wiring layer in a layer identical to a layer of the gate wiring layer.

5. The display device according to claim 4, wherein a lower slit penetrating through the second inorganic insulating layer is formed at an intermediate portion in a width direction of the second inorganic insulating layer, and the gate metal layer covers both side surfaces and a bottom surface of the lower slit.

6. The display device according to claim 5, wherein the gate metal layer has a cross section having a U-shape in the lower slit.

7. The display device according to claim 3, wherein the upper slit is formed in the second inorganic insulating layer, the third inorganic insulating layer, and the fourth inorganic insulating layer.

8. The display device according to claim 1, wherein the metal layer includes a first metal layer, a second metal layer, and a third metal layer that are sequentially layered on the inorganic insulating layer, and peripheral edge portions of the first metal layer and the third metal layer each protrude in an eaves shape with respect to a peripheral edge portion of the second metal layer.

9. The display device according to claim 8, wherein each of the first metal layer and the third metal layer is formed of a titanium-based metal film, and the second metal layer is formed of an aluminum-based metal film.

10. The display device according to claim 1, wherein an organic encapsulation film is layered on the first inorganic encapsulation film, an outer substrate slit is provided in the surface of the resin substrate layer on the side of the thin film transistor layer, the outer substrate slit surrounding the plurality of substrate slits, the inorganic insulating film is separated by the outer substrate slit, the inorganic insulating film protruding in an eaves shape inside the outer substrate slit, and the outer substrate slit is filled with the organic encapsulation film with the first inorganic encapsulation film between the outer substrate slit and the organic encapsulation film.

11. The display device according to claim 10, wherein a dam wall is provided between the plurality of substrate slits and the outer substrate slit, the dam wall being in contact with a peripheral edge portion of the organic encapsulation film with the first inorganic encapsulation film between the dam wall and the peripheral edge portion of the organic encapsulation film.

12. The display device according to claim 10, wherein a second inorganic encapsulation film is layered on the organic encapsulation film, the second inorganic encapsulation film is layered on the first inorganic encapsulation film in a region provided with the plurality of inversely tapered protruding portions and the plurality of substrate slits, and a layered film of the first inorganic encapsulation film and the second inorganic encapsulation film covers the plurality of inversely tapered protruding portions and the plurality of substrate slits.

13. The display device according to claim 1, wherein an electronic component is installed in the through-hole.

14. The display device according to claim 1, wherein the light-emitting function layer is an organic electroluminescence layer.

15. A display device comprising:

a resin substrate layer;

a thin film transistor layer provided on the resin substrate layer and sequentially layered with an inorganic insulating film and a metal wiring layer;

a light-emitting element layer provided on the thin film transistor layer and sequentially layered with a plurality of first electrodes, a common light-emitting function layer, and a common second electrode corresponding to a plurality of subpixels constituting a display region; and a first inorganic encapsulation film covering the light-emitting element layer, wherein a non-display region having an island shape is provided inside the display region, a through-hole penetrating through the resin substrate layer in a thickness direction of the resin substrate layer is provided in the non-display region, a plurality of inversely tapered protruding portions surrounding the through-hole are provided in the non-display region, each of the plurality of inversely tapered protruding portions includes a resin portion formed of the resin substrate layer and an inorganic insulating layer provided on the resin portion and formed of a material identical to a material of the inorganic insulating film in a layer identical to a layer of the inorganic insulating film, the resin portion included in each of the plurality of inversely tapered protruding portions is separated by corresponding slits of a plurality of substrate slits, the plurality of substrate slits surrounding the through-hole on a surface on a side of the thin film transistor layer of the resin substrate layer, the inorganic insulating layer protrudes in an eaves shape toward at least one of a side of the through-hole and a side of the display region from the resin portion in each of the plurality of inversely tapered protruding portions, the first inorganic encapsulation film covers the plurality of inversely tapered protruding portions and the plurality of substrate slits in a region provided with the plurality of inversely tapered protruding portions and the plurality of substrate slits, a metal layer formed of a material identical to a material of the metal wiring layer in a layer identical to a layer of the metal wiring layer is provided on the inorganic insulating layer in at least one of the plurality of inversely tapered protruding portions, and the metal layer includes a first metal layer, a second metal layer, and a third metal layer that are sequentially layered on the inorganic insulating layer, and peripheral edge portions of the first metal layer and the third metal layer each protrude in an eaves shape with respect to a peripheral edge portion of the second metal layer.

16. The display device according to claim 15, wherein each of the first metal layer and the third metal layer is formed of a titanium-based metal film, and the second metal layer is formed of an aluminum-based metal film.

* * * * *